(12) United States Patent
Lee

(10) Patent No.: US 11,937,431 B2
(45) Date of Patent: Mar. 19, 2024

(54) SEMICONDUCTOR DEVICE HAVING GATE ELECTRODE WITH MULTI-LAYERS AND ELECTRONIC SYSTEM INCLUDING THE SAME

(71) Applicant: SAMSUNG ELECTRONICS CO., LTD., Suwon-si (KR)

(72) Inventor: Sanghoon Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 231 days.

(21) Appl. No.: 17/224,695

(22) Filed: Apr. 7, 2021

(65) Prior Publication Data

US 2022/0085047 A1 Mar. 17, 2022

(30) Foreign Application Priority Data

Sep. 15, 2020 (KR) .................. 10-2020-0118361

(51) Int. Cl.
*H10B 43/40* (2023.01)
*H01L 21/28* (2006.01)
(Continued)

(52) U.S. Cl.
CPC ....... *H10B 43/40* (2023.02); *H01L 21/28035* (2013.01); *H01L 21/28114* (2013.01);
(Continued)

(58) Field of Classification Search
CPC ........ H10B 43/40; H10B 41/27; H10B 43/27; H10B 41/41; H01L 21/28035; H01L 21/28114; H01L 29/42376; H01L 29/4925
See application file for complete search history.

(56) References Cited

U.S. PATENT DOCUMENTS 6,140,445 A 10/2000 Su et al.
6,726,733 B2 4/2004 Lee et al.
(Continued)

FOREIGN PATENT DOCUMENTS

CN 1272858 11/2000
CN 1363122 8/2002
(Continued)

OTHER PUBLICATIONS

European Search Report dated Jan. 19, 2022 in corresponding European Patent Application No. 21177708.01 (9 pages).

*Primary Examiner* — Matthew E. Gordon
*Assistant Examiner* — Sean Ayers Winters
(74) *Attorney, Agent, or Firm* — F. CHAU & ASSOCIATES, LLC

(57) ABSTRACT

A semiconductor device includes a substrate having a first area and a second area and an active area limited by an isolation layer in the first area and the second area, a p-type gate electrode doped with p-type impurities and including a p-type lower gate layer and a p-type upper gate layer on the p-type lower gate layer with a first gate dielectric layer disposed between the active area and the p-type gate electrode in the first area, and an n-type gate electrode doped with n-type impurities and including an n-type lower gate layer and an n-type upper gate layer on the n-type lower gate layer with a second gate dielectric layer disposed between the active area and the n-type gate electrode in the second area.

13 Claims, 21 Drawing Sheets

(51) Int. Cl.
*H01L 29/423* (2006.01)
*H01L 29/49* (2006.01)
*H10B 41/27* (2023.01)
*H10B 41/41* (2023.01)
*H10B 43/27* (2023.01)

(52) U.S. Cl.
CPC .... *H01L 29/42376* (2013.01); *H01L 29/4925* (2013.01); *H10B 41/27* (2023.02); *H10B 41/41* (2023.02); *H10B 43/27* (2023.02)

(56) References Cited

U.S. PATENT DOCUMENTS

| | | | |
|---|---|---|---|
| 7,002,178 | B2 | 2/2006 | Chung |
| 8,212,302 | B2 | 7/2012 | Yamazaki et al. |
| 9,553,159 | B2 | 1/2017 | Rouh et al. |
| 10,128,437 | B1* | 11/2018 | Fantini ................ H10N 70/021 |
| 2007/0108498 | A1* | 5/2007 | Lee ........................ H10B 41/30 |
| | | | 257/E29.302 |
| 2008/0237722 | A1 | 10/2008 | Lee |
| 2013/0017629 | A1* | 1/2013 | Pyo ........................ H10B 41/20 |
| | | | 438/692 |
| 2013/0299885 | A1 | 11/2013 | Zhu et al. |
| 2018/0286921 | A1* | 10/2018 | Redaelli ............. G11C 13/0004 |
| 2019/0131301 | A1* | 5/2019 | Lee ........................ H10B 12/31 |
| 2020/0098786 | A1 | 3/2020 | Park et al. |
| 2020/0219775 | A1* | 7/2020 | Pang ............... H01L 21/823842 |
| 2020/0286734 | A1 | 9/2020 | Yoon et al. |

FOREIGN PATENT DOCUMENTS

| | | |
|---|---|---|
| CN | 1452250 | 10/2003 |
| JP | 3339361 | 10/2002 |
| KR | 10-2006-0039140 | 5/2006 |
| KR | 10-1168334 | 7/2012 |

* cited by examiner

SEMICONDUCTOR DEVICE HAVING GATE ELECTRODE WITH MULTI-LAYERS AND ELECTRONIC SYSTEM INCLUDING THE SAME

CROSS-REFERENCE TO RELATED APPLICATION

This application claims priority under 35 U.S.C.§ 119 to Korean Patent Application No. 10-2020-0118361, filed on Sep. 15, 2020, in the Korean Intellectual Property Office, the disclosure of which is incorporated by reference herein in its entirety.

TECHNICAL FIELD

The present inventive concept relates to a semiconductor device and an electronic system including the same, and more particularly, to a semiconductor device having a gate electrode and an electronic system including the same.

DISCUSSION OF RELATED ART

The electronic system has been miniaturized and lightened, in accordance with the new technological breakthroughs in the electronics industry and the constant demand for high-performance electronic systems by users. For this reason, the semiconductor device included in the electronic system is required to be highly integrated and to have high capacity. As the semiconductor device is highly integrated, the size of the gate electrode forming a transistor included in the semiconductor device is reduced accordingly, as a result, short channel effect may occur to deteriorate the characteristics of the semiconductor device. To prevent the short channel effect from occurring, a dual gate transistor having a p-type gate electrode formed of p-type polysilicon is proposed. However, diffusion of the impurity ions used to form the p-type polysilicon is a concern, because it may cause deterioration of the electrical characteristics of the semiconductor device.

SUMMARY

The present inventive concept relates to a semiconductor device having a gate electrode capable of providing high electrical characteristics and an electronic system including the same.

According to an exemplary embodiment of the present inventive concept, there is provided a semiconductor device including a peripheral circuit area formed on a substrate, a semiconductor layer covering the peripheral circuit area, and a memory cell array area formed on the semiconductor layer. The memory cell array area includes a first cell laminated structure and a second cell laminated structure on the first cell laminated structure each including a plurality of insulating layers and a plurality of word line structures alternately laminated on the semiconductor layer and a plurality of channel structures filling a plurality of first channel holes passing through the first cell laminated structure and a plurality of second channel holes connected to the plurality of first channel holes and passing through the second cell laminated structure. The peripheral circuit area includes an active area limited by an isolation layer in the substrate, a gate dielectric layer disposed on the active area, a gate electrode including a lower gate layer and an upper gate layer on the lower gate layer, the lower gate layer being on the gate dielectric layer, and a pair of impurity areas formed in portions of the active area on both sides of the gate electrode in a gate length direction. The upper gate layer covers an upper surface of the lower gate layer and parts of side surfaces of the lower gate layer in a gate width direction orthogonal to the gate length direction of the gate electrode.

According to an exemplary embodiment of the present inventive concept, there is provided a semiconductor device including a substrate having a first area and a second area and an active area limited by an isolation layer in the first area and the second area, a p-type gate electrode doped with p-type impurities and including a p-type lower gate layer and a p-type upper gate layer on the p-type lower gate layer with a first gate dielectric layer interposed between the active area and the p-type gate electrode in the first area, and an n-type gate electrode doped with n-type impurities and including an n-type lower gate layer and an n-type upper gate layer on the n-type lower gate layer with a second gate dielectric layer interposed between the active area and the n-type gate electrode in the second area. The p-type upper gate layer covers an upper surface of the p-type lower gate layer and extends along side surfaces of the p-type lower gate layer in a gate width direction of the p-type gate electrode to contact an upper surface of the isolation layer.

According to an exemplary embodiment of the present inventive concept, there is provided an electronic system including a main substrate, a semiconductor device formed on the main substrate, and a controller electrically connected to the semiconductor device on the main substrate. The semiconductor device includes a gate dielectric layer provided on a semiconductor substrate in an active area limited by an isolation layer, a gate electrode including a lower gate layer formed on the gate dielectric layer and having a laminated structure of a first lower gate layer and a second lower gate layer on the first lower gate layer, and an upper gate layer formed on the lower gate layer and having a laminated structure of a first upper gate layer and a second upper gate layer on the first upper gate layer, and a pair of impurity areas formed in portions of the active area on both sides of the gate electrode in a first horizontal direction. The first upper gate layer extends while covering an upper surface of the second lower gate layer and parts of side surfaces of the lower gate layer in a second horizontal direction orthogonal to the first horizontal direction and contacts an upper surface of the isolation layer. The first lower gate layer and the first upper gate layer include polysilicon that includes carbon, and the second lower gate layer and the second upper gate layer include polysilicon that does not include carbon.

BRIEF DESCRIPTION OF THE DRAWINGS

Exemplary embodiments of the present inventive concept will be more clearly understood from the following detailed description taken in conjunction with the accompanying drawings in which.

Figure 1A:
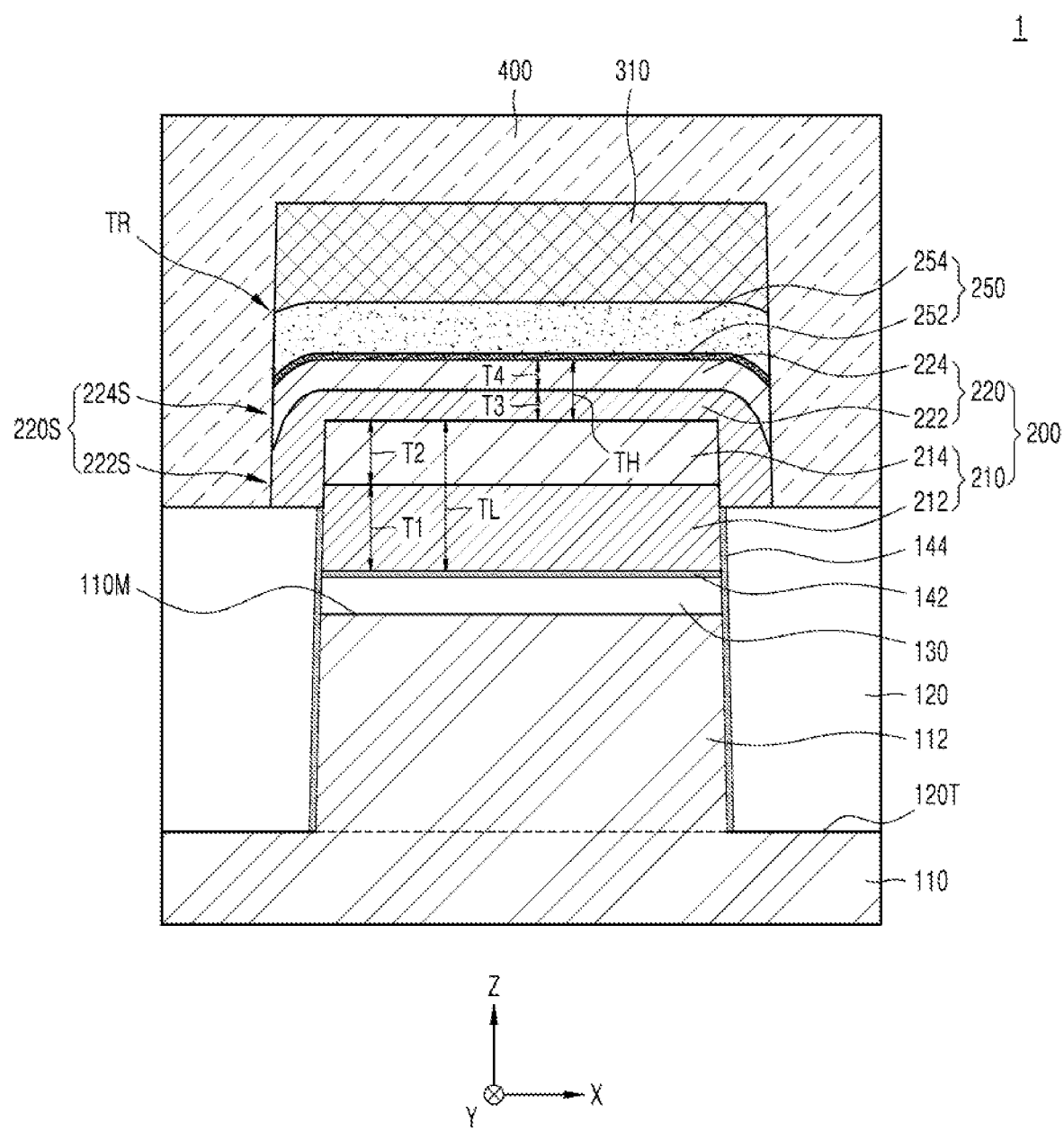
FIGS. 1A and 1B are cross-sectional views illustrating a semiconductor device according to an exemplary embodiment of the present inventive concept.

Since the drawings in FIGS. 1A-14 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 1B:
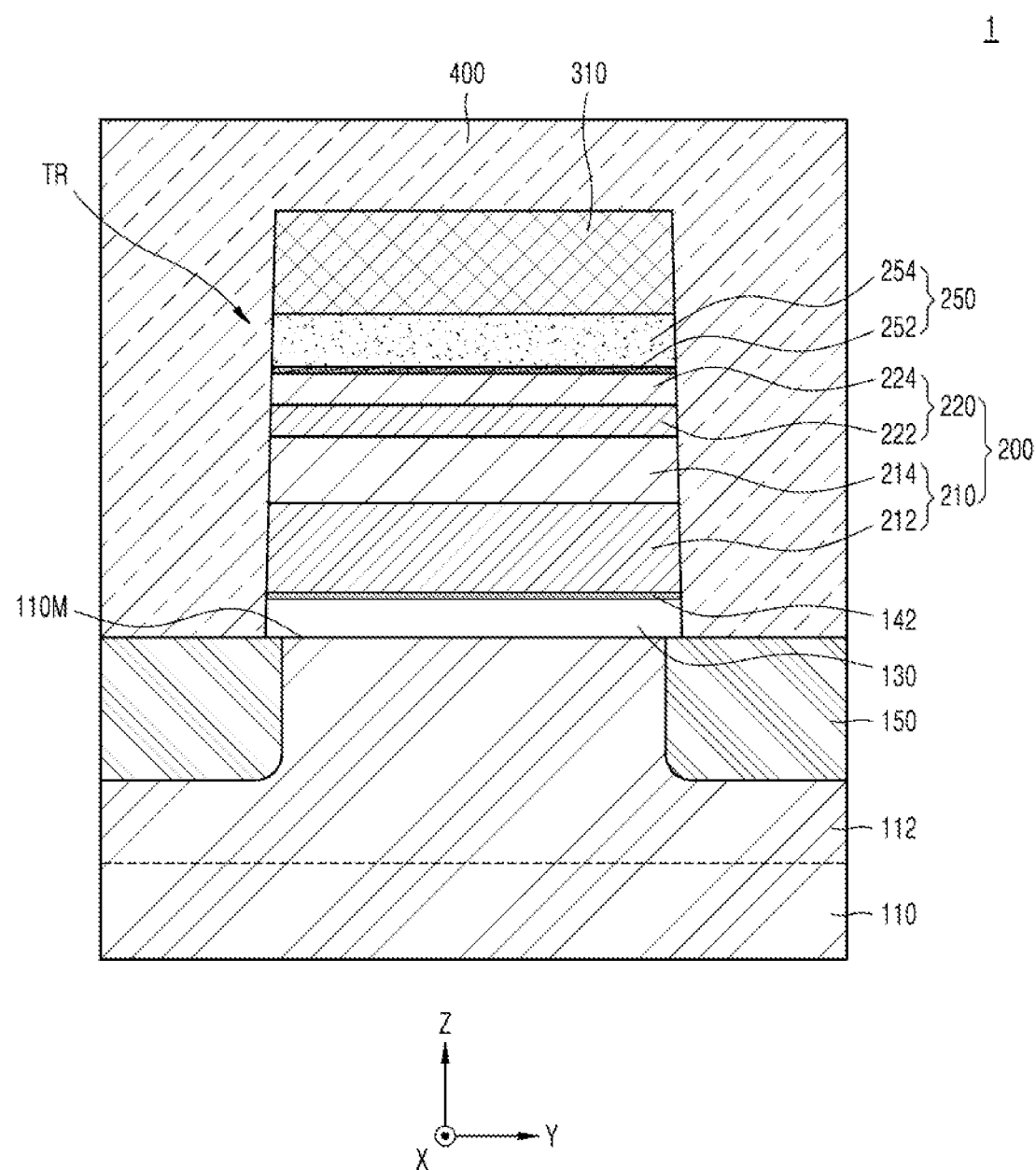

FIGS. 1A and 1B are cross-sectional views illustrating a semiconductor device 1 according to an exemplary embodiment of the present inventive concept. For example, FIGS. 1A and 1B are cross-sectional views taken in directions orthogonal to each other. FIG. 1A is a cross-sectional view illustrating a surface taken in a vertical direction (a Z direction) perpendicular to a first horizontal direction (an X direction), and FIG. 1B is a cross-sectional view illustrating a surface taken in the vertical direction (the Z direction) perpendicular to a second horizontal direction (a Y direction) orthogonal to the first horizontal direction (the X direction).

Referring to FIGS. 1A and 1B, the semiconductor device 1 includes a transistor TR. In an exemplary embodiment of the present inventive concept, the semiconductor device 1 may be a memory device including a plurality of memory cells, and the transistor TR may form a peripheral circuit for driving the plurality of memory cells. For example, the semiconductor device 1 may be a flash memory device including a plurality of flash memory cells, and the transistor TR may form a peripheral circuit for driving the plurality of flash memory cells. Alternatively, for example, the semiconductor device 1 may be a dynamic random access memory (DRAM) device including a plurality of DRAM cells, and the transistor TR may form a peripheral circuit for driving the plurality of DRAM cells. In an exemplary embodiment of the present inventive concept, the semiconductor device 1 may be a logic semiconductor device, such as, for example, a central processing unit (CPU), a microprocessing unit (MPU), a graphics processing unit (GPU), or an application processor (AP), and the transistor TR may form a logic circuit.

The semiconductor device 1 may include a substrate 110 having an active area 112, an isolation layer 120 limiting the active area 112 on the substrate 110, a gate electrode 200 arranged on the active area 112, and a gate dielectric layer 130 disposed between the active area 112 and the gate electrode 200. A pair of impurity areas 150 may be formed in portions of the active area 112, which are on both sides of the gate electrode 200 in the second horizontal direction (the Y direction). The pair of impurity areas 150 may each be an area doped with, for example, n-type impurities or p-type impurities. The active area 112 may be defined on the substrate 110 by the isolation layer 120 filling a substrate trench 120T. The isolation layer 120 may protrude above an upper surface of the active area 112 in the vertical direction (the Z direction) while filling the substrate trench 120T. For example, the active area 112 may correspond to portions of the substrate 110 that are surrounded by the isolation layer 120.

The active area 112, the gate dielectric layer 130, the pair of impurity areas 150, and the gate electrode 200 may form the transistor TR. The pair of impurity areas 150 may be source and drain areas of the transistor TR. A channel region may be formed in the active area 112 between the pair of the impurity areas 150.

The substrate 110 may have a main surface 110M extending in the first horizontal direction (the X direction) and the second horizontal direction (the Y direction). The main surface 110M of the substrate 110 may be the upper surface of the active area 112.

The substrate 110 may include a semiconductor element such as, for example, silicon (Si) or germanium (Ge). Alternatively, the substrate 110 may include a compound semiconductor such as, for example, silicon carbide (SiC), silicon germanium (SiGe), gallium arsenide (GaAs), indium arsenide (InAs), indium antimonide (InSb), lead tellurium (PbTe) compounds, gallium antimonide (GaSb), indium phosphide (InP), or indium gallium arsenide (InGaAs). In an exemplary embodiment of the present inventive concept, the substrate 110 may have a silicon on insulator (SOI) structure, or a silicon germanium on insulator (SGOI) structure. For example, the substrate 110 may include a buried oxide (BOX) layer. The substrate 110 may include a conductive area, for example, a well doped with impurities or a structure doped with impurities. In addition, the substrate 10 may include one or more semiconductor layers or structures and may include active or operable portions of semiconductor devices.

In an exemplary embodiment of the present inventive concept, the substrate 110 may have a second conductivity type well doped with second conductivity type impurities on a first conductivity type substrate doped with first conductivity type impurities, in which the second conductivity type impurities are different from the first conductivity type impurities. The first conductivity type impurities may be, for example, boron (B) ions, and the second conductivity type impurities may be, for example, phosphorous (P) ions, arsenic (As) ions or antimony (Sb) ions. For example, the first conductivity type may be p type and the second conductivity type may ben type. The active area 112 may be limited by the isolation layer 120 in the second conductivity type well. For example, the active area 112 may be an n-type area.

In an exemplary embodiment of the present inventive concept, the substrate 110 may be a second conductivity type substrate doped with the second conductivity type impurities. For example, in an exemplary embodiment of the present inventive concept, the substrate 110 may be a p-type substrate and may have an n-type well. In an exemplary embodiment of the present inventive concept, the substrate 110 may be an n-type substrate. The active area 112 may be limited by the isolation layer 120 in the second conductivity type substrate. For example, the active area 112 may be an n-type area.

The isolation layer 120 may be formed of at least one of, for example, a silicon oxide ($SiO_2$) layer, a silicon nitride ($Si_3N_4$) layer, or a silicon oxynitride (SiON) layer. The isolation layer 120 may include a single layer including one kind of insulating layer, a double layer including two kinds of different insulating layers, or a multilayer including a combination of at least three kinds of insulating layers. For example, the isolation layer 120 may include a silicon oxide ($SiO_2$) layer or a silicon nitride ($Si_3N_4$) layer. For example, the isolation layer 120 may include a double layer including a silicon oxide ($SiO_2$) layer and a silicon nitride ($Si_3N_4$) layer. For example, the isolation layer 120 may include a triple layer including a silicon oxide ($SiO_2$) layer, a silicon nitride ($Si_3N_4$) layer, and a silicon oxide ($SiO_2$) layer sequentially stacked.

The gate dielectric layer 130 may include at least one selected from, for example, a silicon oxide ($SiO_2$) layer, a silicon nitride ($Si_3N_4$) layer, a silicon oxynitride (SiON) layer, an oxide/nitride/oxide (ONO) layer, and a high-k dielectric layer having a dielectric constant greater than that of the silicon oxide ($SiO_2$) layer. For example, the gate dielectric layer 130 may have a dielectric constant in a range from about 10 to about 25. In an exemplary embodiment of the present inventive concept, the gate dielectric layer 130 is formed of at least one material selected from, for example, hafnium oxide ($HfO_2$), hafnium silicate ($HfSiO_4$), hafnium oxynitride (HfON), hafnium silicon oxynitride (HfSiON), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicate ($ZrSiO_4$), zirconium oxynitride (ZrON), zirconium silicon oxynitride (ZrSiON), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead zinc niobate [$Pb(Zn_{1/3}Nb_{2/3})O_3$], and lead scandium tantalum oxide ($Pb(Sc,Ta)O_3$). For example, the gate dielectric layer 130 may be formed of, for example, hafnium oxide ($HfO_2$), aluminum oxide ($Al_2O_3$), hafnium aluminum oxide ($HfAlO_3$), tantalum oxide ($Ta_2O_3$), or titanium oxide ($TiO_2$). For example, the gate dielectric layer 130 may have a thickness in a range from about 15 Å to about 40 Å.

The gate electrode 200 may have a gate width in the first horizontal direction (the X direction) and may have a gate length in the second horizontal direction (the Y direction). Therefore, the first horizontal direction (the X direction) and the second horizontal direction (the Y direction) may be respectively referred to as a gate width direction and a gate length direction. In an exemplary embodiment of the present inventive concept, the gate electrode 200 may be formed of polysilicon (p-Si). In an exemplary embodiment of the present inventive concept, the gate electrode 200 may be doped with the first conductivity type impurities. For example, the gate electrode 200 may be a p-type gate electrode. In an exemplary embodiment of the present inventive concept, the gate electrode 200 may be doped with the second conductivity type impurities. For example, the gate electrode 200 may be an n-type gate electrode.

The gate electrode 200 may have a laminated structure of a lower gate layer 210 and an upper gate layer 220 covering the lower gate layer 210, with the lower gate layer 210 being on the gate dielectric layer 130. For example, the lower gate layer 210 may be interposed between the upper gate layer 220 and the gate dielectric layer 130.

Side surfaces of the lower gate layer 210 in the first horizontal direction (the X direction), that is, the gate width direction, may form continuous surfaces with side surfaces of the active area 112 and side surfaces of the gate dielectric layer 130. For example, these continuous surfaces may be formed at the same time through the same etching process. For example, side surfaces of at least partial upper portion of the active area 112 in the gate width direction, the side surfaces of the gate dielectric layer 130, and the side surfaces of the lower gate layer 210 may be coplanar. The side surfaces of the at least partial upper portion of the active area 112 in the gate width direction, the side surfaces of the gate dielectric layer 130, and the side surfaces of the lower gate layer 210 may be aligned in the vertical direction (the Z direction) or a direction close to the vertical direction (the Z direction). For example, the side surfaces of the active area 112, the side surfaces of the gate dielectric layer 130, and the side surfaces of the lower gate layer 210 described here may be coplanar on the Y-Z plane (i.e., a plane extending in the Y direction and the Z direction) or approximately Y-Z plane. Here, the side surfaces of the at least partial upper portion of the active area 112 in the gate width direction, the side surfaces of the gate dielectric layer 130, and the side surfaces of the lower gate layer 210 are aligned in the vertical direction (the Z direction) or the direction close to the vertical direction (the Z direction) means that a surface formed in the first horizontal direction (the X direction) and the second horizontal direction (the Y direction), the side surfaces of the at least partial upper portion of the active area 112 in the gate width direction, the side surfaces of the gate dielectric layer 130, and the side surfaces of the lower gate layer 210 form an internal angle close to 90°, for example, an internal angle between 80° and 90°. In an exemplary embodiment of the present inventive concept, the lower gate layer 210 may be formed of polysilicon (p-Si).

A width of the upper gate layer 220 in the first horizontal direction (the X direction), that is, the gate width direction, may have a value greater than that of a width of the lower gate layer 210. The upper gate layer 220 may cover at least some portions of the side surfaces and an upper surface of the lower gate layer 210. For example, the upper gate layer 220 may cover the portions of the side surfaces of the lower gate layer 210 protruding above the isolation layer 120. At least partial upper portions of the side surfaces of the lower gate layer 210 in the first horizontal direction (the X direction), that is, the gate width direction, may contact the upper gate layer 220. In an exemplary embodiment of the present inventive concept, the upper gate layer 220 may also be formed of polysilicon (p-Si).

The upper gate layer 220 may include a side surface cover 220S extending from portions covering the upper surface of the lower gate layer 210 and covering the side surfaces of the lower gate layer 210 in the first horizontal direction (the X direction), that is, the gate width direction. The side surface cover 220S may extend from the portion of the upper gate layer 220 covering the upper surface of the lower gate layer 210 to an upper surface of the isolation layer 120 along the side surfaces of the lower gate layer 210 in the first horizontal direction (the X direction), that is, the gate width direction, and may contact the upper surface of the isolation layer 120.

An upper surface of the upper gate layer 220 may extend from a central portion approximately having a flat surface to an edge thereof in the first horizontal direction (the X direction) and may bend toward the substrate 110 at the edge portion thereof. For example, an upper portion of the upper gate layer 220 may be round at an edge thereof in the first horizontal direction (the X direction).

The width of the lower gate layer 210 may have a value the same as that of the width of the upper gate layer 220 in the second horizontal direction (the Y direction), that is, the gate length direction. In an exemplary embodiment of the present inventive concept, the width of the lower gate layer 210 and the width of the upper gate layer 220 in the gate length direction, that is, the gate length of the gate electrode 200, may be in a range from about 0.1 μm to about 0.2 μm. In the second horizontal direction (the Y direction), that is, the gate length direction, side surfaces of the lower gate layer 210 may be aligned with side surfaces of the upper gate layer 220 in the vertical direction (the Z direction). For example, the side surfaces of the lower gate layer 210 may be coplanar with the side surfaces of the upper gate layer 220 in the gate length direction. For example, the side surfaces of the lower gate layer 210, the side surfaces of the gate dielectric layer 130, and the side surfaces of the upper gate layer 220 described here may be coplanar on the X-Z plane (i.e., a plane extending in the X direction and the Z direction) or approximately X-Z plane. For example, these continuous surfaces may be formed through the same etching process at the same time. In an exemplary embodiment of the present inventive concept, the width of the lower gate layer 210 and the width of the upper gate layer 220 in the second horizontal direction (the Y direction), that is, the gate length direction, may be in a range from about 0.1 μm to about 0.2 μm.

A lower thickness TL that is a thickness of the lower gate layer 210 in the vertical direction (the Z direction) may have a value greater than that of an upper thickness TH that is a thickness of the upper gate layer 220. For example, the lower thickness TL may have a value in a range from about 350 Å to about 750 Å and the upper thickness TH may have a value in a range from about 150 Å to about 300 Å.

The lower gate layer 210 may have a laminated structure of a first lower gate layer 212 and a second lower gate layer 214 formed on the first lower gate layer 212. A width of the first lower gate layer 212 may approximately be the same as a width of the second lower gate layer 214 in the first horizontal direction (the X direction) and the second horizontal direction (the Y direction).

The first lower gate layer 212 may be formed of polysilicon (p-Si) doped with carbon (C), and the second lower gate layer 214 may be formed of polysilicon (p-Si) that is not doped with carbon (C). For example, the first lower gate layer 212 may include carbon (C) in a range from about 0.6 atom % to about 5 atom % and the second lower gate layer 214 may not include carbon (C). In an exemplary embodiment of the present inventive concept, the first lower gate layer 212 may include carbon (C) of about 3 atom %.

An average grain size of the first lower gate layer 212 may have a value smaller than that of an average grain size of the second lower gate layer 214. In an exemplary embodiment of the present inventive concept, the average grain size of the first lower gate layer 212 may have a value in a range from about 50% to about 90% of that of the average grain size of the second lower gate layer 214. For example, when the average grain size of the second lower gate layer 214 is about 218 Å, the average grain size of the first lower gate layer 212 may be in a range from about 100 Å to about 190 Å. In an exemplary embodiment of the present inventive concept, the average grain size of the second lower gate layer 214 may be about 218 Å and the average grain size of the first lower gate layer 212 may be about 124 Å.

In the vertical direction (the Z direction), a first thickness T1 that is a thickness of the first lower gate layer 212 may have a value greater than that of a second thickness T2 that is a thickness of the second lower gate layer 214. For example, the first thickness T1 may have a value in a range from about 200 Å to about 450 Å, and the second thickness T2 may have a value in a range from about 150 Å to about 300 Å.

The upper gate layer 220 may have a laminated structure of a first upper gate layer 222 and a second upper gate layer 224 on the first upper gate layer 222. The first upper gate layer 222 and the second upper gate layer 224 may have approximately the same width in the first horizontal direction (the X direction) and the second horizontal direction (the Y direction).

The first upper gate layer 222 may be formed of polysilicon (p-Si) doped with carbon (C), and the second upper gate layer 224 may be formed of polysilicon (p-Si) that is not doped with carbon (C). For example, the first upper gate layer 222 may include carbon (C) in a range from about 0.6 atom % to about 5 atom % and the second upper gate layer 224 may not include carbon (C).

In an exemplary embodiment of the present inventive concept, a ratio of carbon (C) of the first lower gate layer 212 may approximately be the same as a ratio of carbon (C) of the first upper gate layer 222. For example, the first upper gate layer 222 may include carbon (C) of about 3 atom %.

An average grain size of the first upper gate layer 222 may have a value smaller than that of an average grain size of the second upper gate layer 224. In an exemplary embodiment of the present inventive concept, the average grain size of the first upper gate layer 222 may have a value in a range from about 50% to about 90% of that of the average grain size of the second upper gate layer 224. For example, when the average grain size of the second upper gate layer 224 is about 218 Å, the average grain size of the first upper gate layer 222 may be in a range from about 100 Å to about 190 Å. In an exemplary embodiment of the present inventive concept, the average grain size of the second upper gate layer 224 may be about 218 Å, and the average grain size of the first upper gate layer 222 may be about 124 Å.

In an exemplary embodiment of the present inventive concept, the average grain size of the first lower gate layer 212 and the average grain size of the first upper gate layer 222 may have approximately the same value. In an exemplary embodiment of the present inventive concept, the average grain size of the second lower gate layer 214 and the average grain size of the second upper gate layer 224 may have approximately the same value.

On the lower gate layer 210, in the vertical direction (the Z direction), a third thickness T3 that is a thickness of the first upper gate layer 222 and a fourth thickness T4 that is a thickness of the second upper gate layer 224 may have approximately the same value. For example, each of the third thickness T3 and the fourth thickness T4 may have a value in a range from about 75 Å to about 150 Å.

The side surface cover 220S of the upper gate layer 220 may include a first side surface cover 222S that is a portion of the first upper gate layer 222 and a second side surface cover 224S that is a portion of the second upper gate layer 224. The first side surface cover 222S may extend from portions of the first upper gate layer 222 covering the upper surface of the lower gate layer 210, that is, an upper surface of the second lower gate layer 214, to the upper surface of the isolation layer 120 along the side surfaces of the lower gate layer 210 in the first horizontal direction (the X direction), that is, the gate width direction, and may contact the upper surface of the isolation layer 120. The second side surface cover 224S of the second upper gate layer 224 may cover the first side surface cover 222S of the first upper gate layer 222.

The first upper gate layer 222 may cover the upper surface of the lower gate layer 210, that is, the upper surface of the second lower gate layer 214, and at least some portions of the side surfaces of the lower gate layer 210 in the first horizontal direction (the X direction), that is, the gate width direction, and may contact the upper surface of the isolation layer 120. The second upper gate layer 224 may be spaced apart from the lower gate layer 210 and the isolation layer 120 with the first upper gate layer 222 interposed therebetween.

The upper surface of the isolation layer 120 may be at a level lower than that of the upper surface of the lower gate layer 210 in the vertical direction (the Z direction). In an exemplary embodiment of the present inventive concept, the upper surface of the isolation layer 120 may be at a level higher than that of the main surface 110M of the substrate 110, that is, the upper surface of the active area 112 in the vertical direction (the Z direction). In an exemplary embodiment of the present inventive concept, the upper surface of the isolation layer 120 may be at a level lower than that of the upper surface of the second lower gate layer 214 in the vertical direction (the Z direction). In an exemplary embodiment of the present inventive concept, a vertical level of the upper surface of the isolation layer 120 may be between a vertical level of a lower surface of the first lower gate layer 212 and a vertical level of an upper surface of the first lower gate layer 212.

The upper gate layer 220 may cover partial upper portions of side surfaces of the first lower gate layer 212 and entire side surfaces of the second lower gate layer 214 in the first horizontal direction (the X direction), that is, the gate width direction. Here, the side surfaces of the first lower gate layer 212 and the side surfaces of the second lower gate layer 214 may be arranged on the Y-Z plane or approximately Y-Z plane. The first upper gate layer 222 may cover partial upper portions of the side surfaces of the first lower gate layer 212 and the entire side surfaces of the second lower gate layer 214 in the first horizontal direction (the X direction), that is, the gate width direction, and the second upper gate layer 224 may cover an entire upper surface of the first upper gate layer 222. The remaining portions of the side surfaces of the first lower gate layer 212 in the first horizontal direction (the X direction), that is, the gate width direction, may be covered with the isolation layer 120.

On the gate electrode 200, a capping conductive layer 250 and a capping insulation layer 310 may be sequentially laminated. The capping conductive layer 250 may cover an upper surface of the gate electrode 200, that is, an upper surface of the second upper gate layer 224, and the capping insulation layer 310 may cover an upper surface of the capping conductive layer 250.

The capping conductive layer 250 and the capping insulation layer 310 may each have a width approximately the same as that of the upper gate layer 220 in the first horizontal direction (the X direction) and the second horizontal direction (the Y direction). Side surfaces of the upper gate layer 220, the capping conductive layer 250, and the capping insulation layer 310 in the first horizontal direction (the X direction) and the second horizontal direction (the Y direction) may be aligned with each other in the vertical direction (the Z direction). For example, the side surfaces of the upper gate layer 220, the side surfaces of the capping conductive layer 250, and the side surfaces of the capping insulation layer 310 described here may be coplanar on the Y-Z plane or approximately Y-Z plane and coplanar on the X-Z plane or approximately X-Z plane. For example, these side surfaces may be formed through the same etching process at the same time.

In an exemplary embodiment of the present inventive concept, the capping conductive layer 250 may include a first metal conductive layer 252 and a second metal conductive layer 254 covering the first metal conductive layer 252. For example, the first metal conductive layer 252 may be formed of titanium nitride (TiN) or Ti—Si—N (TSN) and the second metal conductive layer 254 may be formed of tungsten (W) or tungsten silicide ($WSi_x$). For example, the first metal conductive layer 252 may perform a function of a diffusion barrier. In an exemplary embodiment of the present inventive concept, the capping insulation layer 310 may include a silicon nitride ($Si_3N_4$) layer.

The pair of impurity areas 150 may be formed in portions of the active area 112 on both sides of the gate electrode 200 in the second horizontal direction (the Y direction). The first conductivity type impurities may be implanted into the pair of impurity areas 150. For example, the pair of impurity areas 150 may be p-type areas. For example, the impurity ions such as boron (B) ions may be implanted into the pair of impurity areas 150.

On the substrate 110, the semiconductor device 1 may further include an interlayer insulating layer 400 covering the pair of impurity areas 150, the gate electrode 200, the capping conductive layer 250, and the capping insulation layer 310. The interlayer insulating layer 400 may include, for example, silicon oxide ($SiO_2$), silicon nitride ($Si_3N_4$), or silicon oxynitride (SiON). In an exemplary embodiment of the present inventive concept, the semiconductor device 1 may further include a conductive contact plug electrically connected to the pair of impurity areas 150 or the capping conductive layer 250 through the interlayer insulating layer 400. The conductive contact plug may be connected to the capping conductive layer 250 or each of the pair of impurity areas 150 via a metal silicide layer, and the conductive contact plug connected to the capping conductive layer 250 may penetrate through the capping insulation layer 310. For example, the conductive contact plug may include, for example, a metal, a conductive metal nitride, or a combination thereof. For example, the conductive contact plug may include tungsten (W), copper (Cu), aluminum (Al), titanium (Ti), tantalum (Ta), titanium nitride (TiN), tantalum nitride (TaN), an alloy thereof, or a combination thereof.

In an exemplary embodiment of the present inventive concept, the semiconductor device 1 may further include a first barrier layer 142 arranged on an upper surface of the gate dielectric layer 130. The first barrier layer 142 may be disposed between the gate dielectric layer 130 and the gate electrode 200 and may prevent impurities doped in the gate electrode 200 from diffusing into the gate dielectric layer 130 and the active area 112. In an exemplary embodiment of the present inventive concept, the first barrier layer 142 may be formed by a decoupled plasma nitridation (DPN) process. For example, the first barrier layer 142 may be formed of nitride or oxynitride.

In an exemplary embodiment of the present inventive concept, in the semiconductor device 1, a second barrier layer 144 arranged along an internal wall of a substrate trench 120T may be formed. The second barrier layer 144 may be disposed between the gate dielectric layer 130 and the isolation layer 120 and between the active area 112 and the isolation layer 120, and may prevent the impurities doped in the gate electrode 200 from diffusing into the gate dielectric layer 130 and the active area 112 through the isolation layer 120. In an exemplary embodiment of the present inventive concept, the second barrier layer 144 may be formed by a DPN process. For example, the second barrier layer 144 may be formed of nitride or oxynitride. In an exemplary embodiment of the present inventive concept, the second barrier layer 144 may be disposed between the gate electrode 200 and the isolation layer 120. For example, the second barrier layer 144 may be disposed between the first lower gate layer 212 and the isolation layer 120.

The semiconductor device 1 according to the present inventive concept includes the gate electrode 200 having the laminated structure of the lower gate layer 210 and the upper gate layer 220 covering the lower gate layer 210. It will be described in detail with reference to FIG. 7E that a preliminary upper gate layer 220PR for forming the upper gate layer 220 may cover the lower gate layer 210 and the isolation layer 120. For example, when boron (B) ions are implanted through an upper surface of the preliminary upper gate layer 220PR in order to form the gate electrode 200 as a p-type gate, because the preliminary upper gate layer 220PR covers the isolation layer 120, boron (B) ions may be prevented from diffusing into the gate dielectric layer 130 and the active area 112 through the isolation layer 120. Because the first preliminary upper gate layer 222PR has the average grain size with the value smaller than that of the average grain size of the second preliminary upper gate layer 224PR, the diffusion of boron (B) ions into the gate dielectric layer 130 and the active area 112 through the isolation layer 120 may be minimized. Also, as described above, the second barrier layer 144 may prevent the boron (B) ions doped in the gate electrode 200 from diffusing into the gate dielectric layer 130 and the active area 112 through the isolation layer 120.

Because, in the semiconductor device 1 according to the present inventive concept, impurities such as boron (B) ions may be prevented from diffusing into the gate dielectric layer 130 and the active area 112 that form the transistor TR, characteristics and dispersion of the transistor TR included in the semiconductor device 1 may be prevented from deteriorating.

Figure 2:
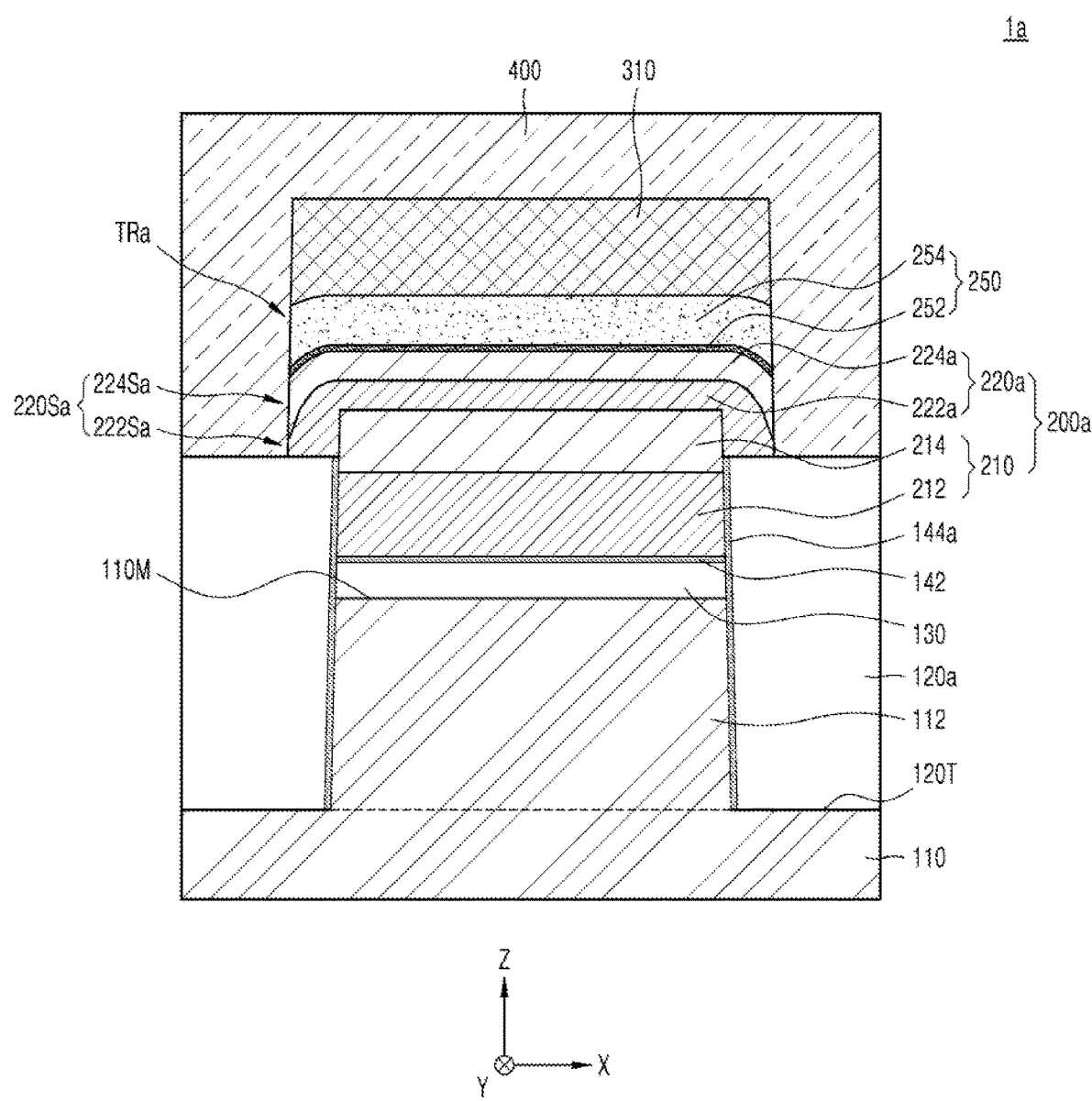
FIG. 2 is a cross-sectional view illustrating a semiconductor device according to an exemplary embodiment of the present inventive concept.

FIG. 2 is a cross-sectional view illustrating a semiconductor device 1a according to an exemplary embodiment of the present inventive concept. In FIG. 2, reference numerals that are the same as those of FIG. 1A denote the same components and previously given description may be omitted. In addition, because a cross-sectional view illustrating the semiconductor device of FIG. 2 taken in a direction orthogonal to that of FIG. 2 is similar to FIG. 1B, additional description will not be given and, if necessary, description will be given with reference to FIG. 1B.

Referring to FIG. 2, the semiconductor device 1a includes a transistor TRa. The semiconductor device 1a may include a substrate 110 having an active area 112, an isolation layer 120a limiting the active area 112 on the substrate 110, a gate electrode 200a arranged on the active area 112, and a gate dielectric layer 130 disposed between the active area 112 and the gate electrode 200a. In the substrate 110, the active area 112 may be defined by the isolation layer 120a filling the substrate trench 120T. The isolation layer 120a may protrude above an upper surface of the active area 112 in the vertical direction (the Z direction) while filling the substrate trench 120T. For example, the active area 112 may correspond to portions of the substrate 110 that are surrounded by the isolation layer 120a.

A pair of impurity areas 150 may be formed in portions of the active area 112, which are on both sides of the gate electrode 200a in the second horizontal direction (the Y direction), as illustrated in FIG. 1B. For example, the pair of impurity areas 150 may each be an area doped with, for example, n-type impurities or p-type impurities. The active area 112, the gate dielectric layer 130, the pair of impurity areas 150, and the gate electrode 200a may form the transistor TRa.

The gate electrode 200a may have a gate width in the first horizontal direction (the X direction) and a gate length in the second horizontal direction (the Y direction). In an exemplary embodiment of the present inventive concept, the gate electrode 200a may be formed of polysilicon (p-Si). In an exemplary embodiment of the present inventive concept, the gate electrode 200a may be doped with the first conductivity type impurities. The first conductivity type impurities may be, for example, boron (B) ions. For example, the gate electrode 200a may be a p-type gate. In an exemplary embodiment of the present inventive concept, the gate electrode 200a may be doped with the second conductivity type impurities. The second conductivity type impurities may be, for example, phosphorous (P) ions, arsenic (As) ions or antimony (Sb) ions. For example, the gate electrode 200a may be an n-type gate.

The gate electrode 200a may have a laminated structure of a lower gate layer 210 and an upper gate layer 220a covering the lower gate layer 210, the lower gate layer 210 being on the gate dielectric layer 130. For example, the lower gate layer 210 may be interposed between the upper gate layer 220a and the gate dielectric layer 130.

A width of the upper gate layer 220a in the first horizontal direction (the X direction), that is, the gate width direction, may have a value greater than that of a width of the lower gate layer 210. The upper gate layer 220a may cover at least some portions of side surfaces of the lower gate layer 210 and an upper surface of the lower gate layer 210. For example, the upper gate layer 220a may cover the portions of the side surfaces of the lower gate layer 210 protruding above the upper surface of the isolation layer 120. At least partial upper portions of the side surfaces of the lower gate layer 210 in the first horizontal direction (the X direction), that is, the gate width direction, may contact the upper gate layer 220a.

The upper gate layer 220a may include a side surface cover 220Sa extending from portions covering the upper surface of the lower gate layer 210 and covering the side surfaces of the lower gate layer 210 in the first horizontal direction (the X direction), that is, the gate width direction. The side surface cover 220Sa may extend from portions of the upper gate layer 220a covering the upper surface of the lower gate layer 210 to an upper surface of the isolation layer 120a along the side surfaces of the lower gate layer 210 in the first horizontal direction (the X direction), that is, the gate width direction, and may contact the upper surface of the isolation layer 120a.

The upper gate layer 220a may have a laminated structure of a first upper gate layer 222a and a second upper gate layer 224a on the first upper gate layer 222a. The first upper gate layer 222a and the second upper gate layer 224a may have approximately the same width in the first horizontal direction (the X direction) and the second horizontal direction (the Y direction). The first upper gate layer 222a may be formed of polysilicon (p-Si) doped with carbon (C), and the second upper gate layer 224a may be formed of polysilicon (p-Si) that is not doped with carbon (C). In an exemplary embodiment of the present inventive concept, a first lower gate layer 212 and the first upper gate layer 222a may include approximately the same ratio of carbon (C).

An average grain size of the first upper gate layer 222a may have a value smaller than that of an average grain size of the second upper gate layer 224a. In an exemplary embodiment of the present inventive concept, an average grain size of the first lower gate layer 212 and the average grain size of the first upper gate layer 222a may have approximately the same value. In an exemplary embodiment of the present inventive concept, an average grain size of the second lower gate layer 214 and the average grain size of the second upper gate layer 224a may have approximately the same value.

The side surface cover 220Sa of the upper gate layer 220a may include a first side surface cover 222Sa that is a part of the first upper gate layer 222a and a second side surface cover 224Sa that is a part of the second upper gate layer 224a. The first side surface cover 222Sa may extend from portions of the first upper gate layer 222a covering the upper surface of the lower gate layer 210, that is, an upper surface of the second lower gate layer 214, to an upper surface of the isolation layer 120a along the side surfaces of the lower gate layer 210 in the first horizontal direction (the X direction), that is, the gate width direction, and may contact the upper surface of the isolation layer 120a. The second side surface cover 224Sa of the second upper gate layer 224a may cover the first side surface cover 222Sa of the first upper gate layer 222a.

The first upper gate layer 222a may cover the upper surface of the lower gate layer 210, that is, the upper surface of the second lower gate layer 214 and at least some portions of the side surfaces of the lower gate layer 210 in the first horizontal direction (the X direction), that is, the gate width direction, and may contact the upper surface of the isolation layer 120a. The second upper gate layer 224a may be spaced apart from the lower gate layer 210 and the isolation layer 120a with the first upper gate layer 222a interposed therebetween.

In an exemplary embodiment of the present inventive concept, the upper surface of the isolation layer 120a may be at a level higher than that of a main surface 110M of the substrate 110, that is, the upper surface of the active area 112 in the vertical direction (the Z direction). In an exemplary embodiment of the present inventive concept, the upper surface of the isolation layer 120a may be at a level lower than that of an upper surface of the lower gate layer 210, that is, the upper surface of the second lower gate layer 214 in the vertical direction (the Z direction). In an exemplary embodiment of the present inventive concept, a vertical level of the upper surface of the isolation layer 120a may be between a vertical level of a lower surface of the second lower gate layer 214 and a vertical level of the upper surface of the second lower gate layer 214.

The upper gate layer 220a may cover partial upper portions of side surfaces of the second lower gate layer 214 in the first horizontal direction (the X direction), that is, the gate width direction. The first upper gate layer 222a may cover partial upper portions of the side surfaces of the second lower gate layer 214 in the first horizontal direction (the X direction), that is, the gate width direction, and the second upper gate layer 224a may cover an entire upper surface of the first upper gate layer 222a. The remaining portions of the side surfaces of the second lower gate layer 214 in the first horizontal direction (the X direction), that is, the gate width direction, and entire side surfaces of the first lower gate layer 212 may be covered with the isolation layer 120a. Here, the side surfaces of the first lower gate layer 212 and the side surfaces of the second lower gate layer 214 may be arranged on the Y-Z plane or approximately Y-Z plane.

A capping conductive layer 250 and a capping insulation layer 310 may be sequentially laminated on the gate electrode 200a. The capping conductive layer 250 may cover an upper surface of the gate electrode 200a, that is, an upper surface of the second upper gate layer 224a, and the capping insulation layer 310 may cover an upper surface of the capping conductive layer 250.

Figure 3:
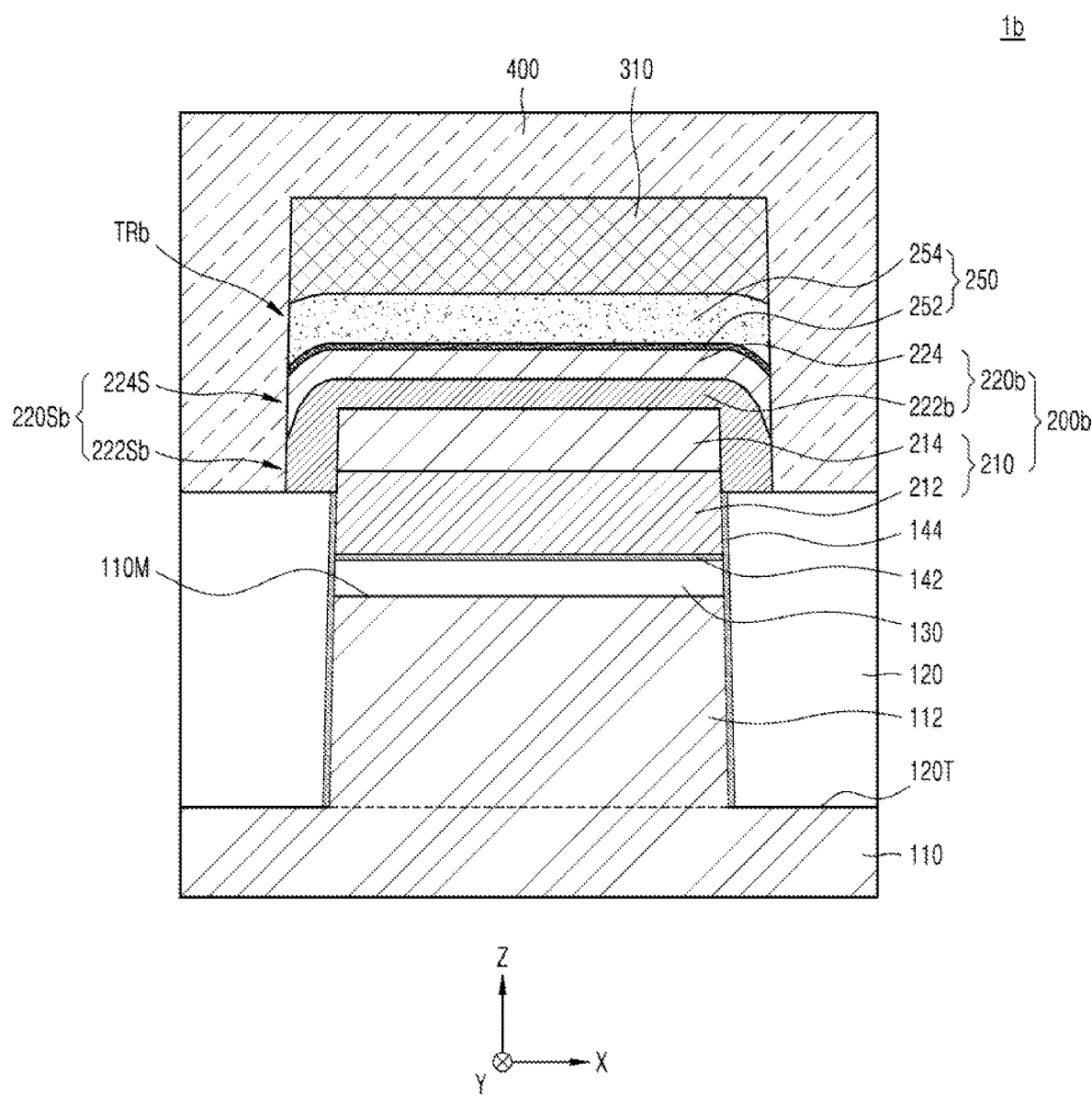
FIG. 3 is a cross-sectional view illustrating a semiconductor device according to an exemplary embodiment of the present inventive concept.

FIG. 3 is a cross-sectional view illustrating a semiconductor device 1b according to an exemplary embodiment of the present inventive concept. In FIG. 3, reference numerals that are the same as those of FIG. 1A denote the same components and previously given description may be omitted. In addition, because a cross-sectional view illustrating the semiconductor device of FIG. 3 taken in a direction orthogonal to that of FIG. 3 is similar to FIG. 1B, additional description will not be given and, if necessary, description will be given with reference to FIG. 1B.

Referring to FIG. 3, the semiconductor device 1b includes a transistor TRb. The semiconductor device 1b may include a substrate 110 having an active area 112, an isolation layer 120 limiting the active area 112 on the substrate 110, a gate electrode 200b arranged on the active area 112, and a gate dielectric layer 130 disposed between the active area 112 and the gate electrode 200b. The isolation layer 120 may protrude above an upper surface of the active area 112 in the vertical direction (the Z direction). For example, the active area 112 may correspond to portions of the substrate 110 that are surrounded by the isolation layer 120.

A pair of impurity areas 150 may be formed in portions of the active area 112, which are on both sides of the gate electrode 200b in the second horizontal direction (the Y direction), as illustrated in FIG. 1B. For example, the pair of impurity areas 150 may each be an area doped with, for example, n-type impurities or p-type impurities. The active area 112, the gate dielectric layer 130, the pair of impurity areas 150, and the gate electrode 200b may form the transistor TRb.

The gate electrode 200b may have a gate width in the first horizontal direction (the X direction) and a gate length in the second horizontal direction (the Y direction). In an exemplary embodiment of the present inventive concept, the gate electrode 200b may be formed of polysilicon (p-Si). In an exemplary embodiment of the present inventive concept, the gate electrode 200b may be doped with the first conductivity type impurities. The first conductivity type impurities may be, for example, boron (B) ions. For example, the gate electrode 200b may be a p-type gate. In an exemplary embodiment of the present inventive concept, the gate electrode 200b may be doped with the second conductivity type impurities. The second conductivity type impurities may be, for example, phosphorous (P) ions, arsenic (As) ions or antimony (Sb) ions. For example, the gate electrode 200b may be an n-type gate.

The gate electrode 200b may have a laminated structure of a lower gate layer 210 and an upper gate layer 220b covering the lower gate layer 210, with the lower gate layer 210 being on the gate dielectric layer 130. For example, the lower gate layer 210 may be interposed between the upper gate layer 220b and the gate dielectric layer 130.

A width of the upper gate layer 220*b* in the first horizontal direction (the X direction), that is, the gate width direction, may have a value greater than that of a width of the lower gate layer 210. The upper gate layer 220*b* may cover at least some portions of side surfaces of the lower gate layer 210 and an upper surface of the lower gate layer 210. For example, the upper gate layer 220*b* may cover the portions of the side surfaces of the lower gate layer 210 protruding above the upper surface of the isolation layer 120. At least partial upper portions of the side surfaces of the lower gate layer 210 in the first horizontal direction (the X direction), that is, the gate width direction, may contact the upper gate layer 220*b*.

The upper gate layer 220*b* may include a side surface cover 220Sb extending from portions covering the upper surface of the lower gate layer 210 and covering the side surfaces of the lower gate layer 210 in the first horizontal direction (the X direction), that is, the gate width direction. The side surface cover 220Sb may extend from portions of the upper gate layer 220*b* covering the upper surface of the lower gate layer 210 to an upper surface of the isolation layer 120 along the side surfaces of the lower gate layer 210 in the first horizontal direction (the X direction), that is, the gate width direction, and may contact the upper surface of the isolation layer 120.

The upper gate layer 220*b* may have a laminated structure of a first upper gate layer 222*b* and a second upper gate layer 224 on the first upper gate layer 222*b*. The first upper gate layer 222*b* and the second upper gate layer 224 may have approximately the same width in the first horizontal direction (the X direction) and the second horizontal direction (the Y direction).

The first upper gate layer 222*b* may be formed of polysilicon (p-Si) doped with carbon (C), and the second upper gate layer 224 may be formed of polysilicon (p-Si) that is not doped with carbon (C). Alternatively, the first upper gate layer 222*b* may be formed of amorphous silicon (a-Si) doped with carbon (C), and the second upper gate layer 224 may be formed of polysilicon (p-Si) that is not doped with carbon (C). In an exemplary embodiment of the present inventive concept, the first upper gate layer 222*b* may include carbon (C) having a ratio higher than that of carbon (C) included in a first lower gate layer 212. For example, the first upper gate layer 222*b* may include carbon (C) of no less than about 10 atom %.

An average grain size of the first upper gate layer 222*b* may have a value smaller than that of an average grain size of the first lower gate layer 212. An average grain size of the first upper gate layer 222*b* may have a value smaller than that of an average grain size of the second upper gate layer 224. In an exemplary embodiment of the present inventive concept, the first upper gate layer 222*b* may be formed of amorphous silicon (a-Si) actually doped with carbon (C), which has an average grain size with a value smaller than that of a measurable average grain size. In an exemplary embodiment of the present inventive concept, the first upper gate layer 222*b* may include polysilicon (p-Si) or amorphous silicon (a-Si) having an average grain size with a value smaller than that of an average grain size of the first lower gate layer 212. In an exemplary embodiment of the present inventive concept, an average grain size of the second lower gate layer 214 and the average grain size of the second upper gate layer 224 may have approximately the same value. The side surface cover 220Sb of the upper gate layer 220*b* may include a first side surface cover 222Sb that is a portion of the first upper gate layer 222*b* and a second side surface cover 224S that is a portion of the second upper gate layer 224. The first side surface cover 222Sb may extend from portions of the first upper gate layer 222*b* covering the upper surface of the lower gate layer 210, that is, an upper surface of the second lower gate layer 214, to an upper surface of the isolation layer 120 along the side surfaces of the lower gate layer 210 in the first horizontal direction (the X direction), that is, the gate width direction, and may contact the upper surface of the isolation layer 120. The second side surface cover 224S of the second upper gate layer 224 may cover the first side surface cover 222Sb of the first upper gate layer 222*b*.

A capping conductive layer 250 and a capping insulation layer 310 may be sequentially laminated on the gate electrode 200*b*. The capping conductive layer 250 may cover an upper surface of the gate electrode 200*b*, that is, an upper surface of the second upper gate layer 224, and the capping insulation layer 310 may cover an upper surface of the capping conductive layer 250.

Figure 4:
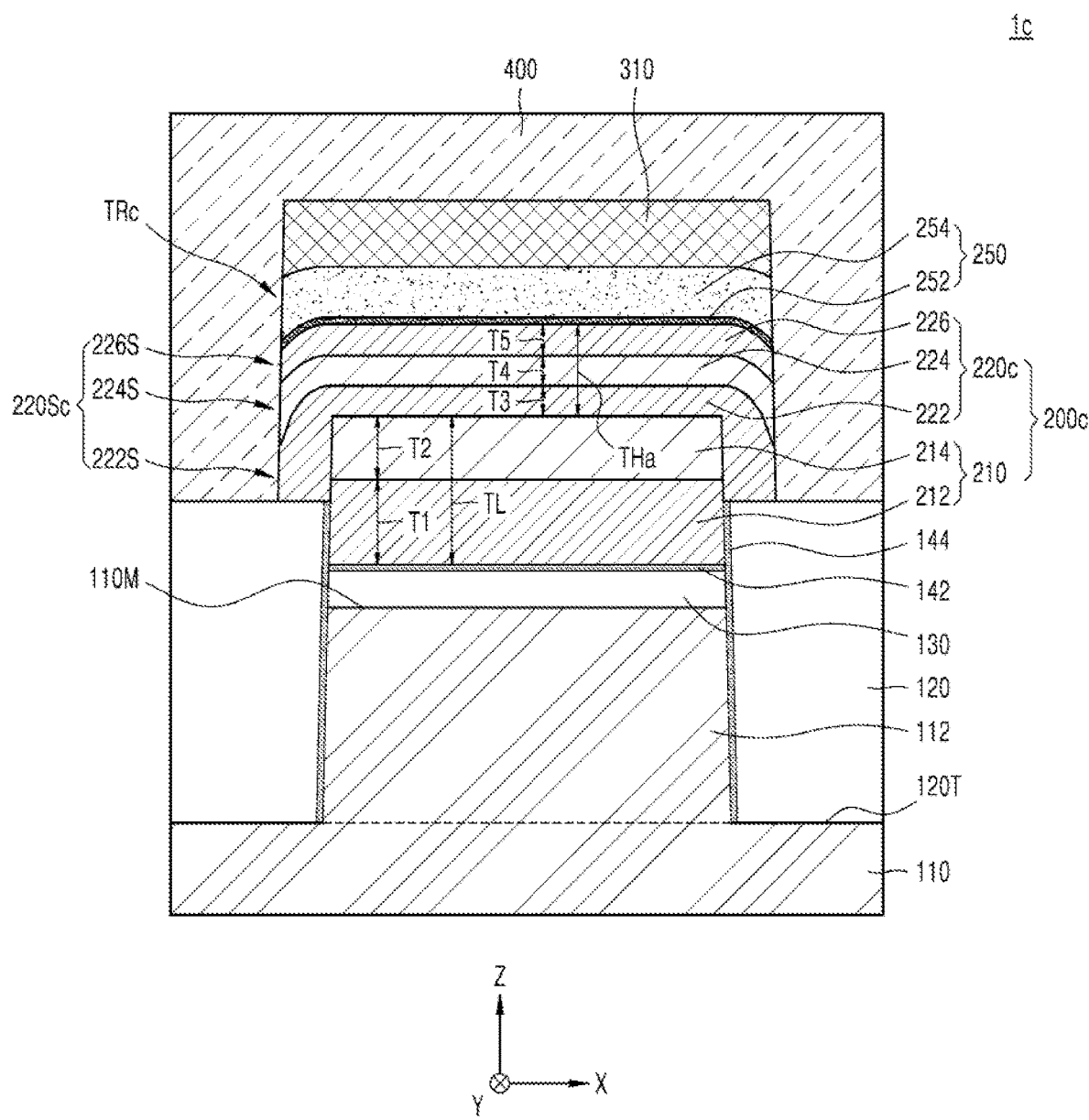
FIG. 4 is a cross-sectional view illustrating a semiconductor device according to an exemplary embodiment of the present inventive concept.

FIG. 4 is a cross-sectional view illustrating a semiconductor device 1*c* according to an exemplary embodiment of the present inventive concept. In FIG. 4, reference numerals that are the same as those of FIG. 1A denote the same components and previously given description may be omitted. In addition, because a cross-sectional view illustrating the semiconductor device of FIG. 4 taken in a direction orthogonal to that of FIG. 4 is similar to FIG. 1B, additional description will not be given and, if necessary, description will be given with reference to FIG. 1B.

Referring to FIG. 4, the semiconductor device 1*c* includes a transistor TRc. The semiconductor device 1*c* may include a substrate 110 having an active area 112, an isolation layer 120 limiting the active area 112 on the substrate 110, a gate electrode 200*c* arranged on the active area 112, and a gate dielectric layer 130 disposed between the active area 112 and the gate electrode 200*c*. The isolation layer 120 may protrude above an upper surface of the active area 112 in the vertical direction (the Z direction). For example, the active area 112 may correspond to portions of the substrate 110 that are surrounded by the isolation layer 120.

A pair of impurity areas 150 may be formed in portions of the active area 112, which are on both sides of the gate electrode 200*c* in the second horizontal direction (the Y direction), as illustrated in FIG. 1B. For example, the pair of impurity areas 150 may each be an area doped with, for example, n-type impurities or p-type impurities. The active area 112, the gate dielectric layer 130, the pair of impurity areas 150, and the gate electrode 200*c* may form the transistor TRc.

The gate electrode 200*c* may have a laminated structure of a lower gate layer 210 and an upper gate layer 220*c* covering the lower gate layer 210, with the lower gate layer 210 being on the gate dielectric layer 130. For example, the lower gate layer 210 may be interposed between the upper gate layer 220*c* and the gate dielectric layer 130.

The upper gate layer 220*c* may have a laminated structure of a first upper gate layer 222, a second upper gate layer 224, and a third upper gate layer 226 sequentially stacked on the lower gate layer 210. That is, unlike the upper gate layer 220 illustrated in FIGS. 1A and 1B, the upper gate layer 220*c* further includes the third upper gate layer 226 covering an upper surface of the second upper gate layer 224. The first upper gate layer 222, the second upper gate layer 224, and the third upper gate layer 226 may have approximately the same width in the first horizontal direction (the X direction) and the second horizontal direction (the Y direction).

The first upper gate layer 222 and the third upper gate layer 226 may be formed of polysilicon (p-Si) doped with carbon (C), and the second upper gate layer 224 may be formed of polysilicon (p-Si) that is not doped with carbon (C). In an exemplary embodiment of the present inventive concept, the first upper gate layer 222 and the third upper gate layer 226 may include approximately the same ratio of carbon (C).

In an exemplary embodiment of the present inventive concept, the first upper gate layer 222 may include carbon (C) having a ratio higher than that of carbon (C) included in the third upper gate layer 226. For example, the third upper gate layer 226 may include carbon (C) in a range from about 0.6 atom % to about 5 atom % and the first upper gate layer 222 may include carbon (C) of no less than about 10 atom %.

In the vertical direction (the Z direction), a lower thickness TL that is a thickness of the lower gate layer 210 may have a value greater than that of an upper thickness THa that is a thickness of the upper gate layer 220c. For example, the lower thickness TL may have a value in a range from about 350 Å to about 750 Å, and the upper thickness THa may have a value in a range from about 250 Å to about 450 Å.

In the vertical direction (the Z direction), a first thickness T1 that is a thickness of a first lower gate layer 212 may have a value greater than that of a second thickness T2 that is a thickness of a second lower gate layer 214. For example, the first thickness T1 may have a value in a range from about 200 Å to about 450 Å and the second thickness T2 may have a value in a range from about 150 Å to about 300 Å.

On the lower gate layer 210, in the vertical direction (the Z direction), a third thickness T3 that is a thickness of the first upper gate layer 222, a fourth thickness T4 that is a thickness of the second upper gate layer 224, and a fifth thickness T5 that is a thickness of the third upper gate layer 226 may have approximately the same value. For example, each of the third thickness T3, the fourth thickness T4, and the fifth thickness T5 may have a value in a range from about 75 Å to about 150 Å.

Figure 5:
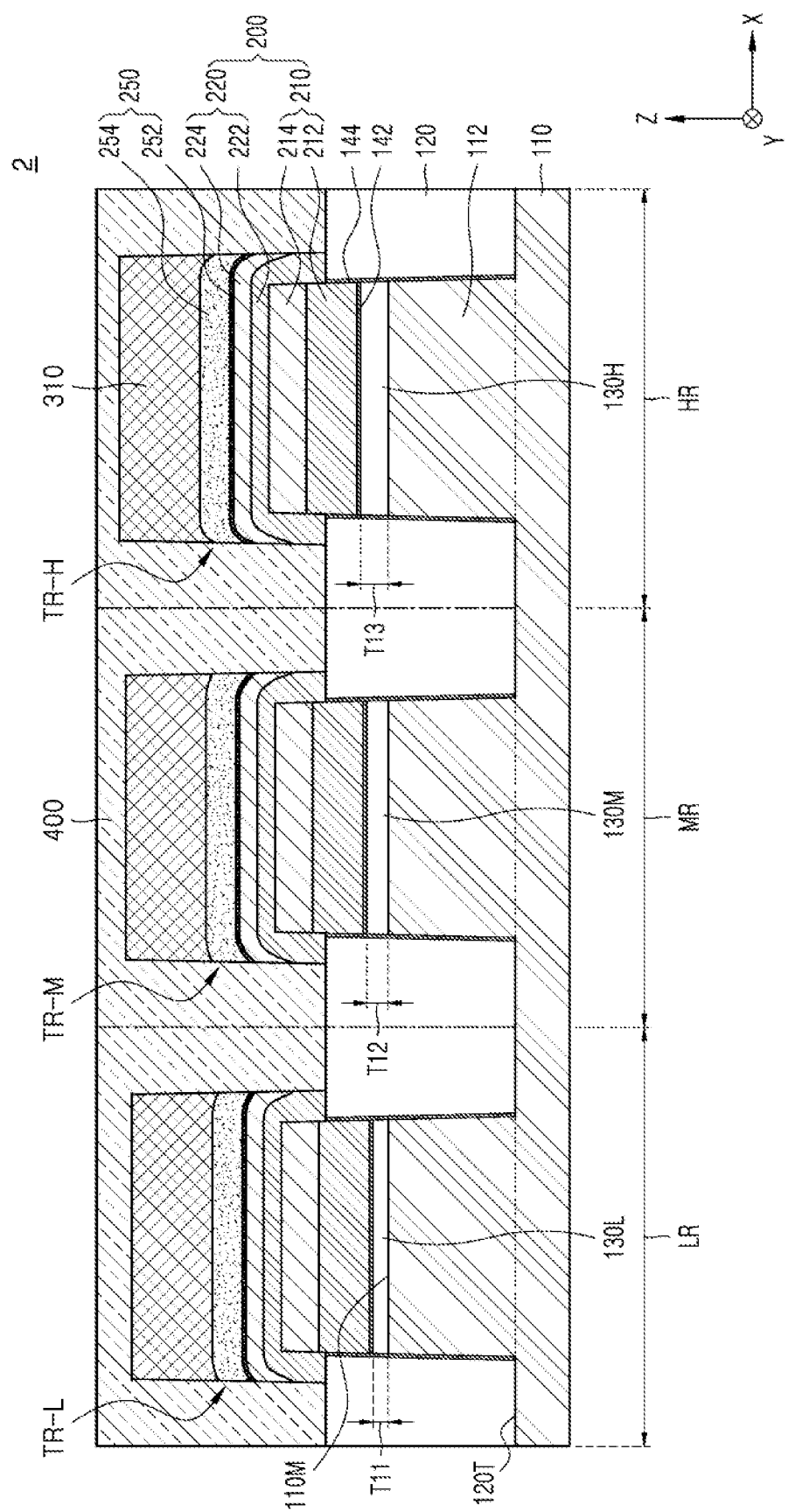
FIG. 5 is a cross-sectional view illustrating a semiconductor device according to an exemplary embodiment of the present inventive concept.

FIG. 5 is a cross-sectional view illustrating a semiconductor device 2 according to an exemplary embodiment of the present inventive concept.

Referring to FIG. 5, the semiconductor device 2 includes a substrate 110 arranged in a first area LR, a second area MR, and a third area HR, a first transistor TR-L arranged in the first area LR, a second transistor TR-M arranged in the second area MR, and a third transistor TR-H arranged in the third area HR. Because the transistor TR of the semiconductor device 1 illustrated in FIGS. 1A and 1B is similar to the first transistor TR-L, the second transistor TR-M, and the third transistor TR-H of the semiconductor device 2 illustrated in FIG. 5 except that, instead of the transistor TR of the semiconductor device 1 illustrated in FIGS. 1A and 1B including the gate dielectric layer 130, the first transistor TR-L of the semiconductor device 2 illustrated in FIG. 5 includes a first gate dielectric layer 130L, the second transistor TR-M includes a second gate dielectric layer 130M, and the third transistor TR-H includes a third gate dielectric layer 130H, previously given description may be omitted.

The first gate dielectric layer 130L may be thinner than the second gate dielectric layer 130M, and the second gate dielectric layer 130M may be thinner than the third gate dielectric layer 130H. For example, the first gate dielectric layer 130L may have a thickness in a range from about 15 Å to about 40 Å, the second gate dielectric layer 130M may have a thickness in a range from about 45 Å to about 70 Å, and the third gate dielectric layer 130H may have a thickness in a range from about 200 Å to about 500 Å. For example, the first transistor TR-L may be a low voltage transistor having a low operating voltage, the third transistor TR-H may be a high voltage transistor having a high operating voltage, and the second transistor TR-M may be a medium voltage transistor having an operating voltage between the operating voltage of the first transistor TR-L and the operating voltage of the third transistor TR-H. For example, the operating voltage may increase from the first transistor TR-L to the third transistor TR-H in accordance with the increase in thickness from the first gate dielectric layer 130L to the third gate dielectric layer 130H.

In an exemplary embodiment of the present inventive concept, each of the first gate dielectric layer 130L, the second gate dielectric layer 130M, and the third gate dielectric layer 130H may be formed through a separate process. In an exemplary embodiment of the present inventive concept, a part of the second gate dielectric layer 130M or a part of the third gate dielectric layer 130H may be formed with the first gate dielectric layer 130L through a first process, and the remaining part of the second gate dielectric layer 130M or the remaining part of the third gate dielectric layer 130H may be formed through a second process separate from the first process.

A gate electrode 200 included in each of the first transistor TR-L, the second transistor TR-M, and the third transistor TR-H may be formed through the same process. Similar to the semiconductor device 1, because, in the semiconductor device 2 according to the present inventive concept, impurities ions may be prevented from diffusing into the first, second and third gate dielectric layers 130L, 130M and 130H and the active area 112 that form the first, second and third transistors TR-L, TR-M and TR-H, characteristics and dispersion of the first, second and third transistors TR-L, TR-M and TR-H included in the semiconductor device 2 may be prevented from deteriorating.

Figure 6:
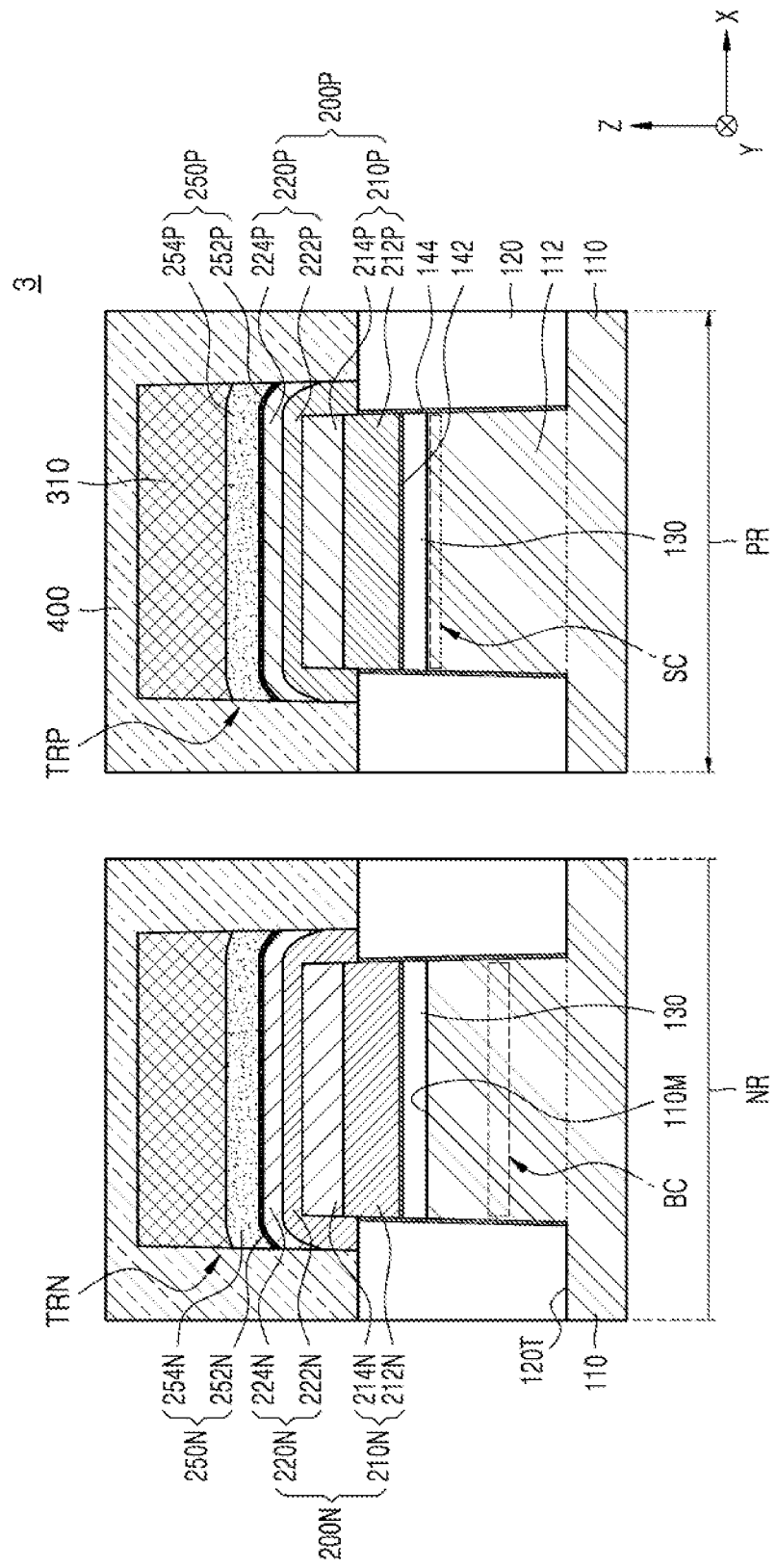
FIG. 6 is a cross-sectional view illustrating a semiconductor device according to an exemplary embodiment of the present inventive concept.

FIG. 6 is a cross-sectional view illustrating a semiconductor device 3 according to an exemplary embodiment of the present inventive concept. In FIG. 6, reference numerals that are the same as those of FIG. 1A denote the same components and previously given description may be omitted. In addition, because a cross-sectional view illustrating the semiconductor device of FIG. 6 taken in a direction orthogonal to that of FIG. 6 is similar to FIG. 1B, additional description will not be given and, if necessary, description will be given with reference to FIG. 1B.

Referring to FIG. 6, the semiconductor device 3 includes a substrate 110 having a first area PR and a second area NR, a first transistor TRP arranged in the first area PR, and a second transistor TRN arranged in the second area NR.

The semiconductor device 3 may include the substrate 110 having an active area 112, an isolation layer 120 limiting the active area 112 on the substrate 110, a p-type gate electrode 200P arranged on the active area 112 in the first area PR, an n-type gate electrode 200N arranged on the active area 112 in the second area NR, and a gate dielectric layer 130. In the first area PR, the gate dielectric layer 130 may be disposed between the active area 112 and the p-type gate electrode 200P and, in the second area NR, the gate dielectric layer 130 may be disposed between the active area 112 and the n-type gate electrode 200N. The isolation layer 120 may protrude above an upper surface of the active area 112 in the vertical direction (the Z direction). For example, the active area 112 may correspond to portions of the substrate 110 that are surrounded by the isolation layer 120.

A pair of impurity areas 150 may be formed in portions of the active area 112, which are on both sides of the p-type gate electrode 200P, and portions of the active area 112, which are on both sides of the n-type gate electrode 200N, in the second horizontal direction (the Y direction) as illustrated in FIG. 1B. For example, the pair of impurity areas 150 may each be an area doped with, for example, n-type impurities or p-type impurities. The active area 112, the gate dielectric layer 130, the pair of impurity areas 150, and the p-type gate electrode 200P may form the first transistor TRP, and the active area 112, the gate dielectric layer 130, the pair of impurity areas 150, and the n-type gate electrode 200N may form the second transistor TRN.

The p-type gate electrode 200P may be doped with the first conductivity type impurities, and the n-type gate electrode 200N may be doped with the second conductivity type impurities. For example, the first conductivity type impurities may be, for example, boron (B) ions, and the second conductivity type impurities may be, for example, phosphorous (P) ions, arsenic (As) ions or antimony (Sb) ions.

Because a shape of the p-type gate electrode 200P of the first transistor TRP and a shape of the n-type gate electrode 200N of the second transistor TRN are approximately the same as a shape of the gate electrode 200 illustrated in FIGS. 1A and 1B, detailed description thereof will be omitted.

The p-type gate electrode 200P may have a laminated structure of a p-type lower gate layer 210P and a p-type upper gate layer 220P covering the p-type lower gate layer 210P. The p-type lower gate layer 210P may have a laminated structure of a first p-type lower gate layer 212P and a second p-type lower gate layer 214P on the first p-type lower gate layer 212P. The p-type upper gate layer 220P may have a laminated structure of a first p-type upper gate layer 222P and a second p-type upper gate layer 224P on the first p-type upper gate layer 222P.

The n-type gate electrode 200N may have a laminated structure of an n-type lower gate layer 210N and an n-type upper gate layer 220N covering the n-type lower gate layer 210N. The n-type lower gate layer 210N may have a laminated structure of a first n-type lower gate layer 212N and a second n-type lower gate layer 214N on the first n-type lower gate layer 212N. The n-type upper gate layer 220N may have a laminated structure of a first n-type upper gate layer 222N and a second n-type upper gate layer 224N on the first n-type upper gate layer 222N.

The p-type gate electrode 200P and the n-type gate electrode 200N are formed together by approximately the same manufacturing process. However, the p-type gate electrode 200P and the n-type gate electrode 200N may be formed by implanting different conductivity type impurities by separately performing the impurity implantation process illustrated in FIG. 7E on the first area PR and the second area NR. For example, the p-type gate electrode 200P may be formed by implanting the first conductivity type impurities such as, for example, boron (B) ions, and the n-type gate electrode 200N may be formed by implanting the second conductivity type impurities such as, for example, phosphorous (P) ions, arsenic (As) ions or antimony (Sb) ions. Because the p-type gate electrode 200P of the first transistor TRP and the n-type gate electrode 200N of the second transistor TRN are approximately the same as the gate electrode 200 illustrated in FIGS. 1A and 1B except that the p-type gate electrode 200P of the first transistor TRP and the n-type gate electrode 200N of the second transistor TRN are doped with different conductivity type impurities from those of the gate electrode 200 illustrated in FIGS. 1A and 1B, detailed description thereof will not be given.

In the first transistor TRP, a surface channel SC may be formed along a main surface 110M of the substrate 110, that is, an upper surface of the active area 112. In the second transistor TRN, a buried channel BC may be formed away from the main surface 110M of the substrate 110, that is, the upper surface of the active area 112, at a low level in the vertical direction (the Z direction). The surface channel SC formed in the first transistor TRP may connect upper portions of the pair of impurity areas 150 illustrated in FIG. 1B, and the buried channel BC formed in the second transistor TRN may connect approximately medium portions of the pair of impurity areas 150 illustrated in FIG. 1B in the vertical direction (the Z direction).

Similar to the semiconductor device 1, because, in the semiconductor device 3 according to the present inventive concept, boron (B) ions may be prevented from diffusing into the gate dielectric layer 130 and the active area 112 that form the first transistor TRP, and phosphorous (P) ions, arsenic (As) ions or antimony (Sb) ions may be prevented from diffusing into the gate dielectric layer 130 and the active area 112 that form the second transistor TRN, characteristics and dispersion of the first and second transistors TRP and TRN included in the semiconductor device 3 may be prevented from deteriorating.

FIGS. 7A to 7G are cross-sectional views illustrating a method of manufacturing a semiconductor device 1 in accordance with a process order according to an exemplary embodiment of the present inventive concept. For example, FIGS. 7A to 7G are cross-sectional views illustrating the method of manufacturing the semiconductor device 1 illustrated in FIGS. 1A and 1B.

Figure 7A:
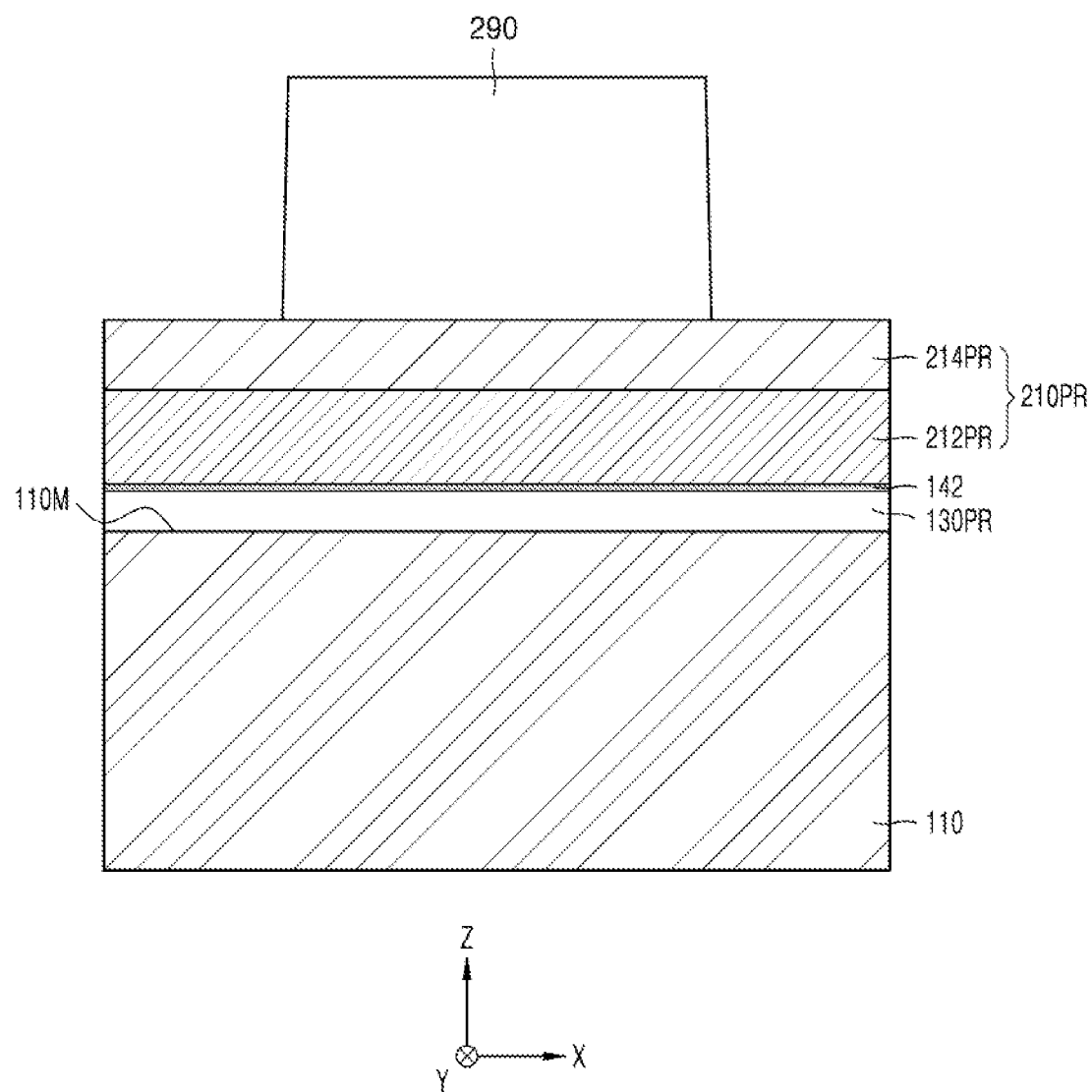
FIGS. 7A to 7G are cross-sectional views illustrating a method of manufacturing a semiconductor device in accordance with a process order according to an exemplary embodiment of the present inventive concept.

Referring to FIG. 7A, a preliminary gate dielectric layer 130PR is formed on the substrate 110 having the main surface 110M extending in the first horizontal direction (the X direction) and the second horizontal direction (the Y direction). The preliminary gate dielectric layer 130PR may be formed of at least one selected from, for example, a silicon oxide ($SiO_2$) layer, a silicon nitride ($Si_3N_4$) layer, a silicon oxynitride (SiON) layer, an oxide/nitride/oxide (ONO) layer, and a high-k dielectric layer having a dielectric constant greater than that of the silicon oxide ($SiO_2$) layer. For example, the preliminary gate dielectric layer 130PR may have a dielectric constant in a range from about 10 to about 25. The preliminary gate dielectric layer 130PR may be formed by a chemical vapor deposition (CVD) process or an atomic layer deposition (ALD) process.

The semiconductor device 2 illustrated in FIG. 5 may be manufactured by forming a first preliminary gate dielectric layer, a second preliminary gate dielectric layer, and a third preliminary gate dielectric layer for forming the first gate dielectric layer 130L, the second gate dielectric layer 130M, and the third gate dielectric layer 130H on the substrate 110 in the first area LR, the second area MR, and the third area HR instead of the preliminary gate dielectric layer 130PR illustrated in FIG. 7A. For example, the first preliminary gate dielectric layer may be thinner than the second preliminary gate dielectric layer, and the second preliminary gate dielectric layer may be thinner than the third preliminary gate dielectric layer.

In an exemplary embodiment of the present inventive concept, the first barrier layer 142 arranged along an upper surface of the preliminary gate dielectric layer 130PR may be formed by performing the DPN process on the preliminary gate dielectric layer 130PR. For example, the first barrier layer 142 may be formed of nitride or oxynitride.

Then, a preliminary lower gate layer 210PR having a laminated structure of a first preliminary lower gate layer 212PR and a second preliminary lower gate layer 214PR is formed by sequentially forming the first preliminary lower gate layer 212PR and the second preliminary lower gate layer 214PR on the preliminary gate dielectric layer 130PR.

In an exemplary embodiment of the present inventive concept, the preliminary lower gate layer 210PR may be formed of amorphous silicon (a-Si) and then, may be crystallized as polysilicon (p-Si) through heat treatment in a subsequent process. For example, the first preliminary lower gate layer 212PR may be formed of amorphous silicon (a-Si) doped with carbon (C) and then, may be crystallized to polysilicon (p-Si) through heat treatment in a subsequent process and the second preliminary lower gate layer 214PR may be formed of amorphous silicon (a-Si) that is not doped with carbon (C) and then, may be crystallized to polysilicon (p-Si) through heat treatment in a subsequent process.

In an exemplary embodiment of the present inventive concept, the preliminary lower gate layer 210PR may be formed of polysilicon (p-Si). For example, the first preliminary lower gate layer 212PR may be formed of polysilicon (p-Si) doped with carbon (C) and the second preliminary lower gate layer 214PR may be formed of polysilicon (p-Si) that is not doped with carbon (C).

The first preliminary lower gate layer 212PR and the second preliminary lower gate layer 214PR may be respectively deposited on the preliminary gate dielectric layer 130PR by using a chemical vapor deposition (CVD) process or an atomic layer deposition (ALD) process. The first preliminary lower gate layer 212PR may be deposited on the preliminary gate dielectric layer 130PR in a state of being doped with carbon (C) by using a precursor including carbon (C).

In an exemplary embodiment of the present inventive concept, the first preliminary lower gate layer 212PR may include carbon (C) in a range from about 0.6 atom % to about 5 atom %. In an exemplary embodiment of the present inventive concept, the first preliminary lower gate layer 212PR may include carbon (C) of about 3 atom %.

An average grain size of the first preliminary lower gate layer 212PR may have a value smaller than that of an average grain size of the second preliminary lower gate layer 214PR. In an exemplary embodiment of the present inventive concept, the average grain size of the first preliminary lower gate layer 212PR may have a value in a range from about 50% to about 90% of that of the average grain size of the second preliminary lower gate layer 214PR. For example, when the average grain size of the second preliminary lower gate layer 214PR is about 218 Å, the average grain size of the first preliminary lower gate layer 212PR may be in a range from about 100 Å to about 190 Å. In an exemplary embodiment of the present inventive concept, the average grain size of the second preliminary lower gate layer 214PR may be about 218 Å and the average grain size of the first preliminary lower gate layer 212PR may be about 124 Å.

Figure 7B:
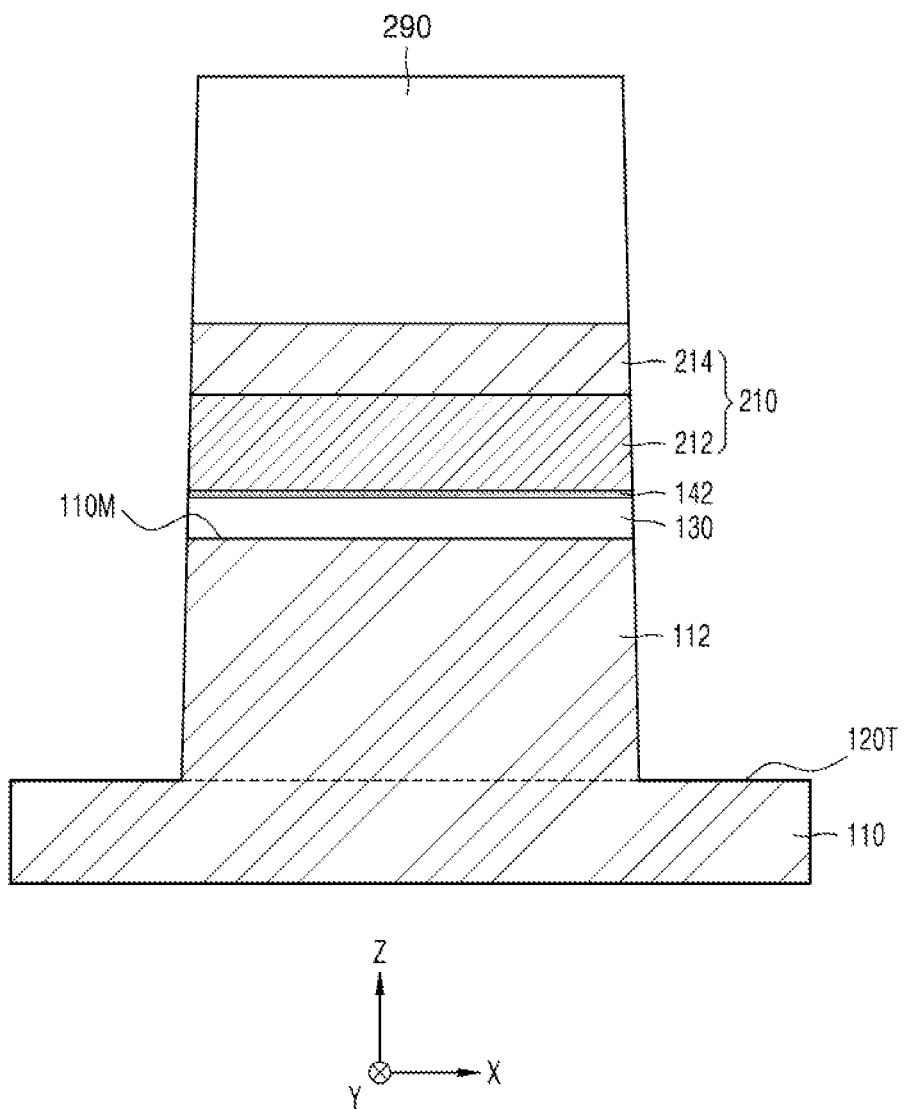

Referring to FIGS. 7A and 7B, a first mask layer 290 may be formed on the preliminary lower gate layer 210PR. The first mask layer 290 may be formed of silicon oxide ($SiO_2$) or photoresist or may be a laminated structure of silicon oxide ($SiO_2$) or photoresist. The first mask layer 290 may be formed by a photolithography process or may be formed by a photolithography process followed by an etching process.

After forming a first mask material layer covering the preliminary lower gate layer 210PR and a photoresist pattern covering a part of the first mask material layer, the first mask layer 290 may be formed by etching the first mask material layer by using the photoresist pattern as an etching mask. The etching process may be an anisotropic etching process, for example, a reactive ion etching (RIE) process. The first mask material layer may be formed of silicon oxide ($SiO_2$). For example, the first mask material layer may be silicon oxide ($SiO_2$) formed by using a plasma enhanced chemical vapor deposition (PECVD) process. Then, by removing parts of the preliminary lower gate layer 210PR, the preliminary gate dielectric layer 130PR, and the substrate 110 by using the first mask layer 290 as the etching mask, the active area 112 limited by the lower gate layer 210, the gate dielectric layer 130, and the substrate trench 120T may be formed. For example, the active area 112 may be defined by the substrate trench 120T. After the etching process, side surfaces of the lower gate layer 210 in the first horizontal direction (the X direction), may form continuous surfaces with side surfaces of the active area 112 and side surfaces of the gate dielectric layer 130. For example, the side surfaces of the active area 112, the side surfaces of the gate dielectric layer 130, and the side surfaces of the lower gate layer 210 described here may be coplanar on the Y-Z plane (i.e., a plane extending in the Y direction and the Z direction) or approximately Y-Z plane.

Figure 7C:
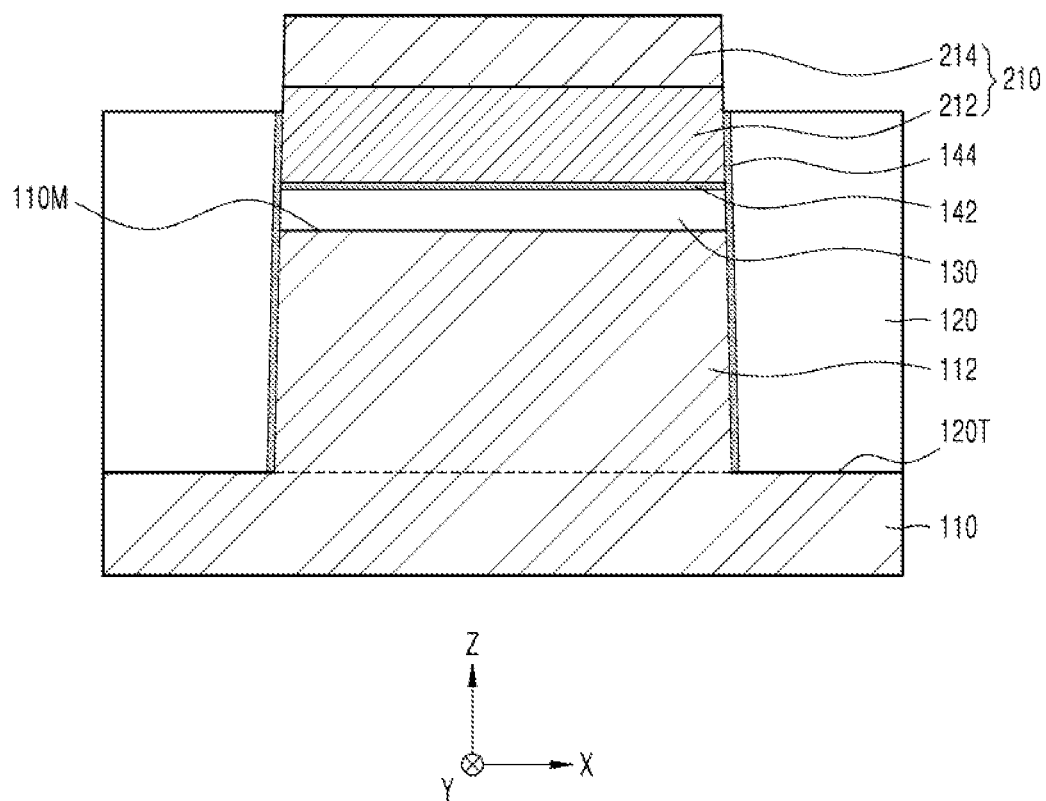

Referring to FIGS. 7B and 7C, after forming an isolation material layer filling the substrate trench 120T on the resultant material of FIG. 7B, by removing a partial upper portion of the isolation material layer, the isolation layer 120 filling the substrate trench 120T and covering partial lower portions of side walls of the lower gate layer 210 is formed.

After forming the isolation material layer and then, performing a planarizing process of removing a part of the isolation material layer and the first mask layer 290 until the upper surface of the lower gate layer 210 is exposed, by selectively further removing another part of the isolation material layer, the isolation layer 120 having an upper surface positioned at a level lower than that of the upper surface of the lower gate layer 210 in the vertical direction (the Z direction) may be formed.

In an exemplary embodiment of the present inventive concept, before forming the isolation material layer, by performing the DPN process on the substrate trench 120T, the second barrier layer 144 arranged along an internal wall of the substrate trench 120T may be formed. For example, the second barrier layer 144 may be formed of nitride or oxynitride.

In an exemplary embodiment of the present inventive concept, by removing another part of the isolation layer to a level lower than the upper surface of the first lower gate layer 212 and higher than the main surface 110M of the substrate, that is, the upper surface of the active area 112 in the vertical direction (the Z direction), the isolation layer 120 illustrated in FIG. 1A may be formed.

In an exemplary embodiment of the present inventive concept, by removing another part of the isolation layer to a level lower than the upper surface of the second lower gate layer 214 and higher than the lower surface of the second lower gate layer 214, that is, the upper surface of the first lower gate layer 212 in the vertical direction (the Z direction), the isolation layer 120a illustrated in FIG. 2 may be formed.

Figure 7D:
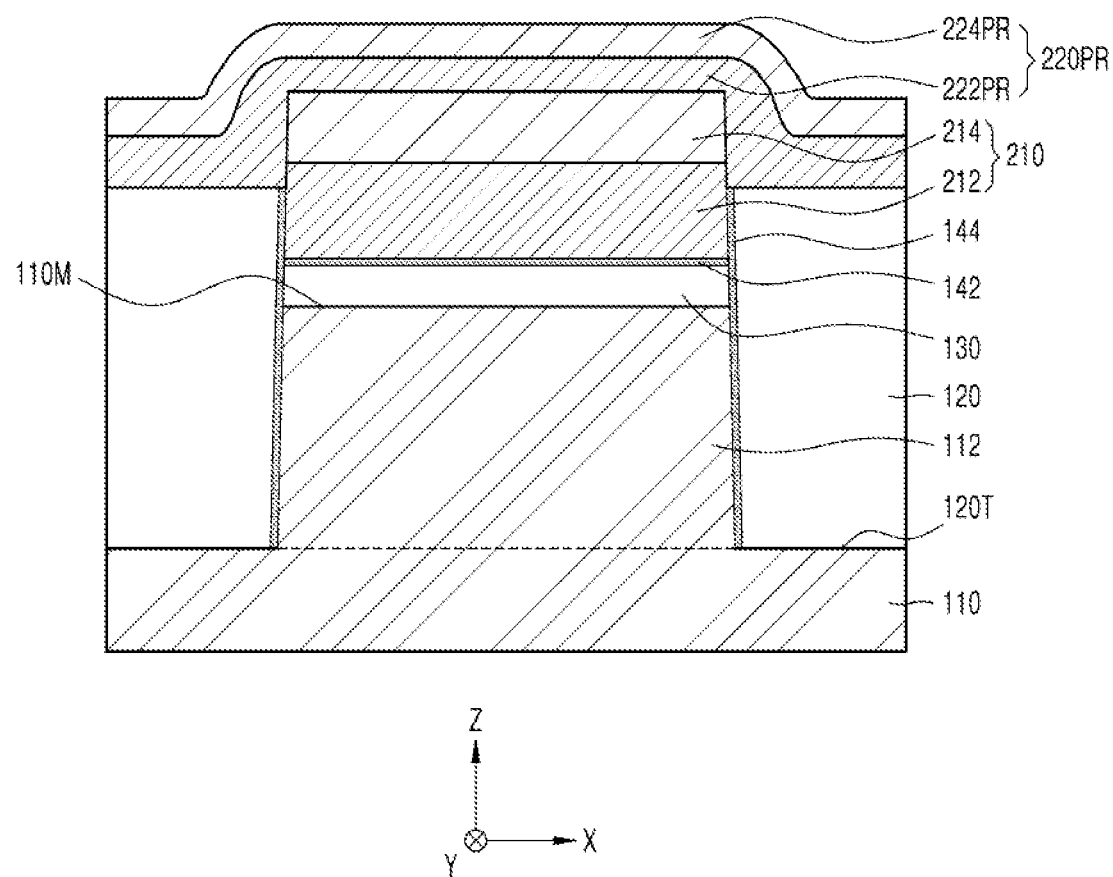

Referring to FIG. 7D, by sequentially forming a first preliminary upper gate layer 222PR and a second preliminary upper gate layer 224PR on the lower gate layer 210 and the isolation layer 120, the preliminary upper gate layer 220PR having a laminated structure of the first preliminary upper gate layer 222PR and the second preliminary upper gate layer 224PR is formed.

In an exemplary embodiment of the present inventive concept, the preliminary upper gate layer 220PR may be formed of amorphous silicon (a-Si) and then, may be crystallized to polysilicon (p-Si) through heat treatment in a subsequent process. For example, the first preliminary upper gate layer 222PR may be formed of amorphous silicon (a-Si) doped with carbon (C) and then, may be crystallized to polysilicon (p-Si) through heat treatment in a subsequent process and the second preliminary upper gate layer 224PR may be formed of amorphous silicon (a-Si) that is not doped with carbon (C) and then, may be crystallized to polysilicon (p-Si) through heat treatment in a subsequent process.

In an exemplary embodiment of the present inventive concept, the preliminary upper gate layer 220PR may be formed of polysilicon (p-Si). For example, the first preliminary upper gate layer 222PR may be formed of polysilicon (p-Si) doped with carbon (C) and the second preliminary upper gate layer 224PR may be formed of polysilicon (p-Si) that is not doped with carbon (C).

The first preliminary upper gate layer 222PR and the second preliminary upper gate layer 224PR may be formed by a chemical vapor deposition (CVD) process or an atomic layer deposition (ALD) process. The first preliminary upper gate layer 222PR may be deposited on the lower gate layer 210 and the isolation layer 120 in a state of being doped with carbon (C) by using a precursor including carbon (C).

In an exemplary embodiment of the present inventive concept, the first preliminary upper gate layer 222PR may include carbon (C) in a range from about 0.6 atom % to about 5 atom %. In an exemplary embodiment of the present inventive concept, the first preliminary upper gate layer 222PR and the first lower gate layer 212 may include approximately the same ratio of carbon (C). In an exemplary embodiment of the present inventive concept, the first preliminary upper gate layer 222PR may include carbon (C) of about 3 atom %.

An average grain size of the first preliminary upper gate layer 222PR may have a value smaller than that of an average grain size of the second preliminary upper gate layer 224PR. In an exemplary embodiment of the present inventive concept, the average grain size of the first preliminary upper gate layer 222PR may have a value in a range from about 50% to about 90% of that of the average grain size of the second preliminary upper gate layer 224PR. For example, when the average grain size of the second preliminary upper gate layer 224PR is about 218 Å, the average grain size of the first preliminary upper gate layer 222PR may be in a range from about 100 Å to about 190 Å. In an exemplary embodiment of the present inventive concept, the average grain size of the second preliminary upper gate layer 224PR may be about 218 Å, and the average grain size of the first preliminary upper gate layer 222PR may be about 124 Å.

The first preliminary upper gate layer 222PR may cover the upper surface of the isolation layer 120 and the side surfaces and upper surface of the lower gate layer 210 and the second preliminary upper gate layer 224PR may cover the upper surface of the first preliminary upper gate layer 222PR. The second preliminary upper gate layer 224PR may be spaced apart from the lower gate layer 210 and the isolation layer 120 with the first preliminary upper gate layer 222PR interposed therebetween.

The semiconductor device 1b illustrated in FIG. 3 may be manufactured by forming the first preliminary upper gate layer 222PR so as to include carbon (C) having a ratio higher than that of carbon (C) included in the first lower gate layer 212, for example, carbon (C) of no less than about 10 atom %.

The semiconductor device 1c illustrated in FIG. 4 may be manufactured by forming a third preliminary upper gate layer corresponding to the third upper gate layer 226 on the second preliminary upper gate layer 224PR. For example, the third preliminary upper gate layer corresponding to the third upper gate layer 226 may include carbon (C) in a range from about 0.6 atom % to about 5 atom % and the first preliminary upper gate layer 222PR may include carbon (C) of no less than about 10 atom %.

Figure 7E:
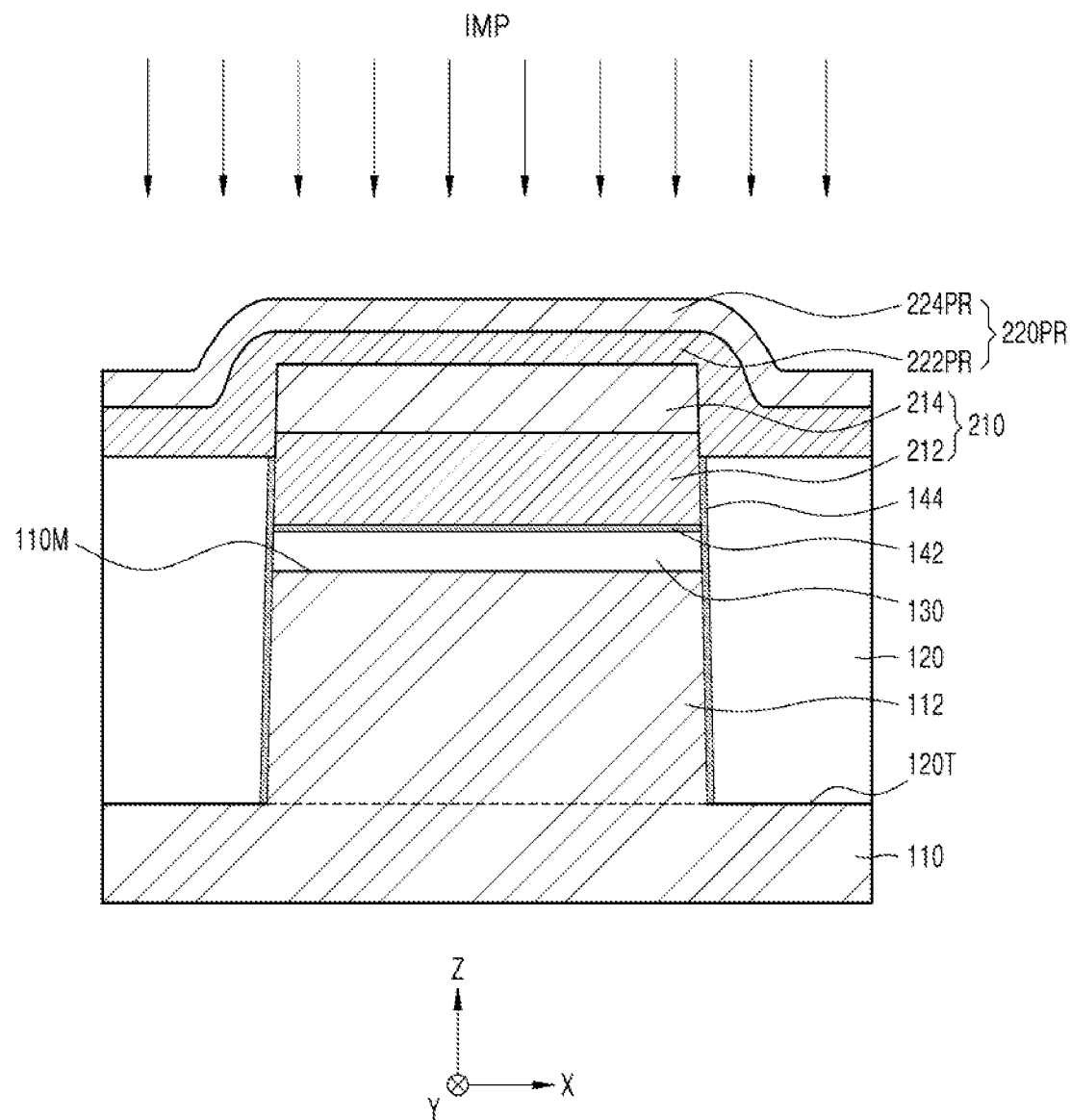

Referring to FIG. 7E, after implanting impurities having conductivity into the preliminary upper gate layer 220PR by performing an ion implantation process (IMP), by performing a heat treatment process, the impurities having conductivity may be doped in the preliminary upper gate layer 220PR and the lower gate layer 210. In an exemplary embodiment of the present inventive concept, through the heat treatment process, the preliminary upper gate layer 220PR and the lower gate layer 210 may be crystallized. For example, the preliminary upper gate layer 220PR and the lower gate layer 210 may be formed of amorphous silicon (a-Si) and then, may be crystallized to polysilicon (p-Si) through heat treatment.

The semiconductor device 3 illustrated in FIG. 6 may be manufactured by implanting n-type impurities into the second area NR and implanting p-type impurities into the first area PR and then, performing the heat treatment process. For example, the p-type impurities may include, for example, boron (B) ions, and the n-type impurities may include, for example, phosphorous (P) ions, arsenic (As) ions or antimony (Sb) ions.

Because the first preliminary upper gate layer 222PR has the average grain size with the value smaller than that of the average grain size of the second preliminary upper gate layer 224PR, diffusion of the impurities having conductivity into the gate dielectric layer 130 through the first preliminary upper gate layer 222PR and the isolation layer 120 may be minimized. In addition, because the first lower gate layer 212 has the average grain size with the value smaller than that of the average grain size of the second lower gate layer 214, diffusion of the impurities having conductivity into the second lower gate layer 214 through the first preliminary upper gate layer 222PR into the gate dielectric layer 130 through the first lower gate layer 212 may be minimized.

Figure 7F:
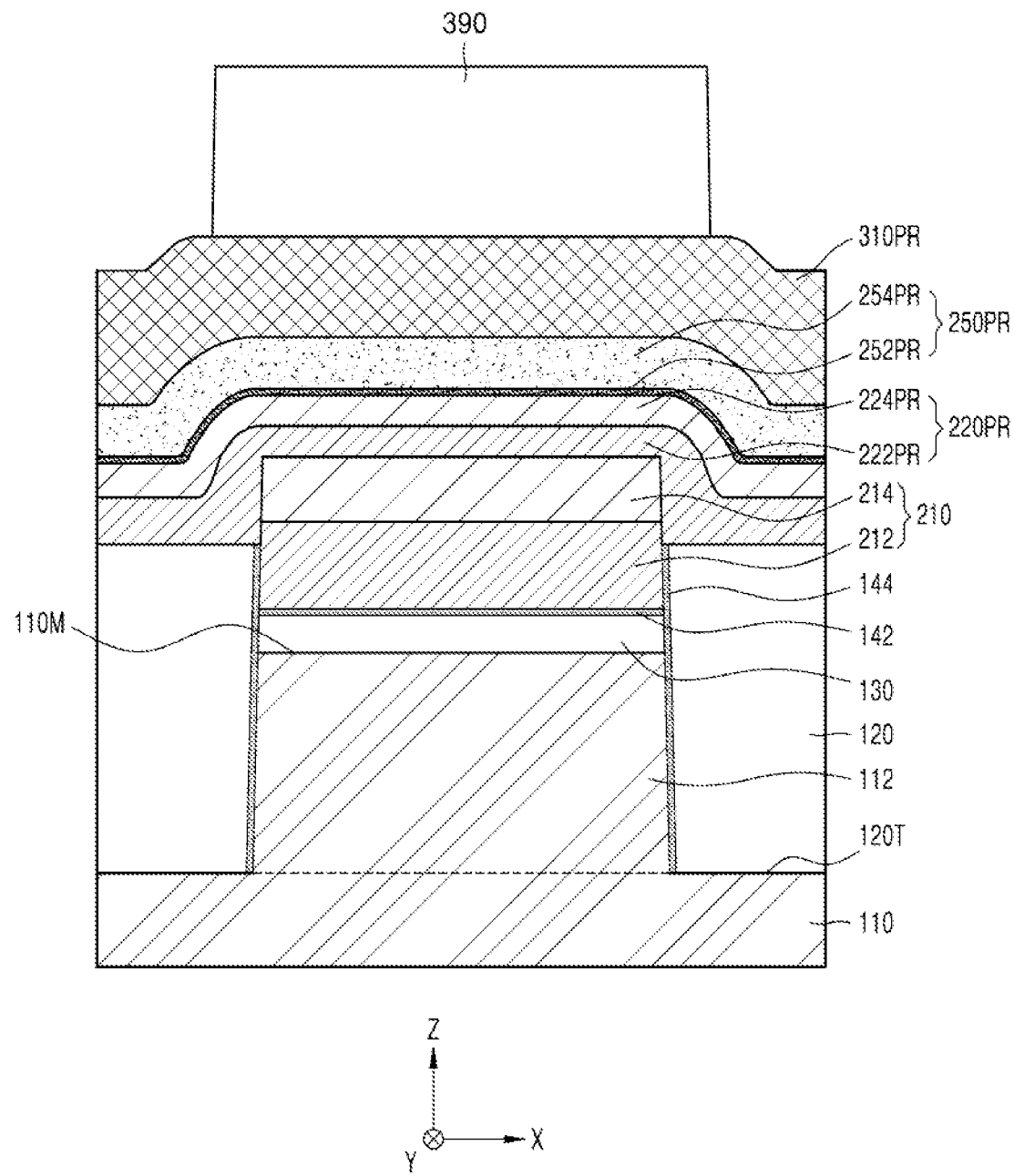

Referring to FIG. 7F, a preliminary capping conductive layer 250PR and a preliminary capping insulation layer 310PR are sequentially formed on the preliminary upper gate layer 220PR. In an exemplary embodiment of the present inventive concept, the preliminary capping conductive layer 250PR may include a first preliminary metal conductive layer 252PR and a second preliminary metal conductive layer 254PR covering the first preliminary metal conductive layer 252PR.

The first preliminary metal conductive layer 252PR may be formed of, for example, titanium nitride (TiN) or TSN (Ti—Si—N) and the second preliminary metal conductive layer 254PR may be formed of, for example, tungsten (W) or tungsten silicide ($WSi_x$). In an exemplary embodiment of the present inventive concept, the preliminary capping insulation layer 310PR may include a silicon nitride ($Si_3N_4$) layer.

Then, a second mask layer 390 may be formed on the preliminary capping insulation layer 310PR. The second mask layer 390 may be formed of, for example, a spin on hardmask (SOH) material, silicon oxide ($SiO_2$), silicon oxynitride (SiON), or photoresist or may be a laminated structure of at least two of an SOH material, silicon oxide ($SiO_2$), silicon oxynitride (SiON), or photoresist. The second mask layer 390 may be formed by a photolithography process or may be formed by a photolithography process followed by an etching process.

Figure 7G:
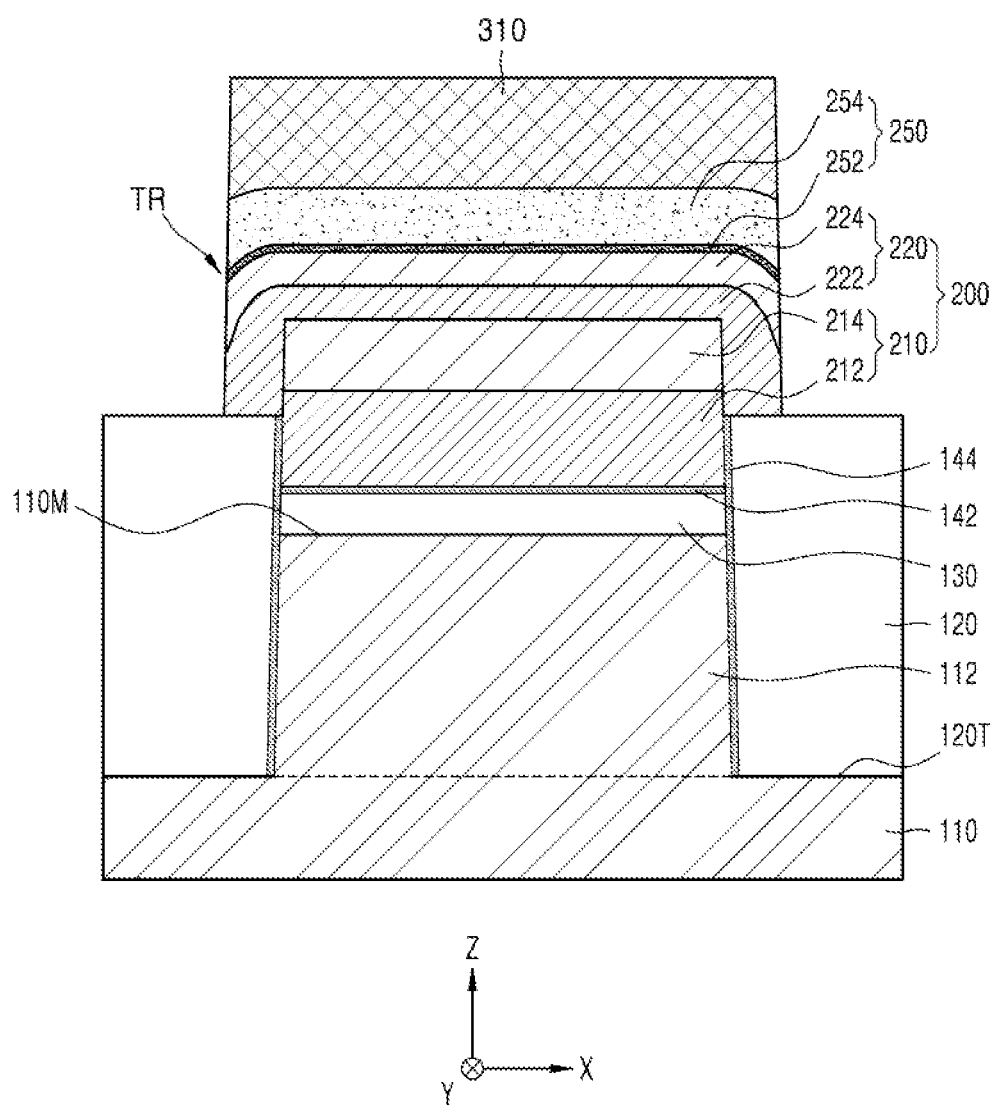

Referring to FIGS. 7F and 7G, by patterning the preliminary capping insulation layer 310PR, the preliminary capping conductive layer 250PR, and the preliminary upper gate layer 220PR by using the second mask layer 390 as an etching mask, the capping insulation layer 310, the capping conductive layer 250, and the upper gate layer 220 are formed. After the etching process, side surfaces of the upper gate layer 220, the capping conductive layer 250, and the capping insulation layer 310 in the first horizontal direction (the X direction) and the second horizontal direction (the Y direction) may be aligned with each other in the vertical direction (the Z direction). For example, the side surfaces of the upper gate layer 220, the side surfaces of the capping conductive layer 250, and the side surfaces of the capping insulation layer 310 described here may be coplanar on the Y-Z plane or approximately Y-Z plane, and coplanar on the X-Z plane or approximately X-Z plane. Then, as illustrated in FIG. 1B, by implanting impurities, for example, n-type impurities or p-type impurities into the active area 112 that is not covered with the upper gate layer 220, the pair of impurity areas 150 are formed in the portions of the active area 112, which are on both sides of the gate electrode 200 in the second horizontal direction (the Y direction) and, as illustrated in FIGS. 1A and 1B, by forming the interlayer insulating layer 400 covering the pair of impurity areas 150, the gate electrode 200, the capping conductive layer 250, and the capping insulation layer 310 on the substrate, the semiconductor device 1 may be formed.

Figure 8:
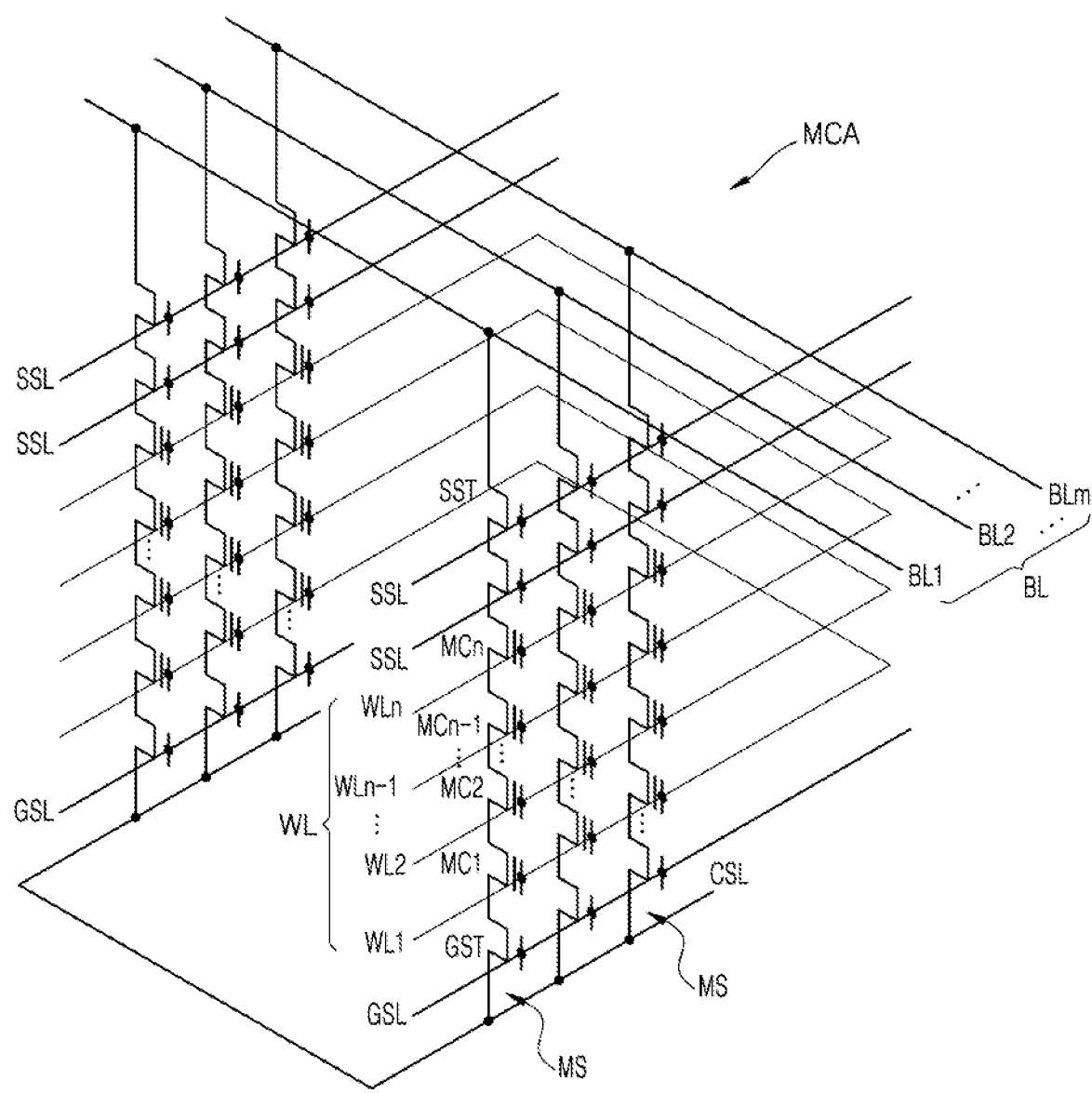
FIG. 8 is an equivalent circuit diagram of a memory cell array included in a semiconductor device according to an exemplary embodiment of the present inventive concept.

FIG. 8 is an equivalent circuit diagram of a memory cell array included in a semiconductor device according to an exemplary embodiment of the present inventive concept. In FIG. 8, an equivalent circuit diagram of a vertical NAND flash memory device having a vertical channel structure is illustrated.

Referring to FIG. 8, each of the semiconductor devices 1, 1a, 1b, 1c, 2, and 3 illustrated in FIGS. 1A to 6 may include a memory cell array MCA. The transistors TR, TRa, TRb, and TRc of the semiconductor devices 1, 1a, 1b, and 1c illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6 may form a peripheral circuit for driving the memory cell array MCA.

The memory cell array MCA may include a plurality of memory cell strings MS. The memory cell array MCA may include a plurality of bit lines BL1, BL2, . . . , and BLm, a plurality of word lines WL1, WL2, . . . , WLn-1, and WLn, at least one string selection line SSL, at least one ground selection line GSL, and a common source line CSL. The plurality of memory cell strings MS may be formed between the plurality of bit lines BL1, BL2, . . . , and BLm and the common source line CSL.

Each of the plurality of memory cell strings MS may include at least one string selection transistor SST, at least one ground selection transistor GST, and a plurality of memory cell transistors MC1, MC2, . . . , MCn-1, and MCn. Conductive plugs of the plurality of string selection transistors SST may be connected to the plurality of bit lines BL1, BL2, . . . , and BLm and source areas of the plurality of ground selection transistors GST may be connected to the common source line CSL. The common source line CSL may be commonly connected to source areas of the plurality of ground selection transistors GST.

The string selection transistor SST may be connected to the string selection line SSL and the ground selection transistor GST may be connected to the ground selection line GSL. The plurality of memory cell transistors MC1, MC2, . . . , MCn-1, and MCn may be respectively connected to the plurality of word lines WL1, WL2, . . . , WLn-1, and WLn.

Figure 9:
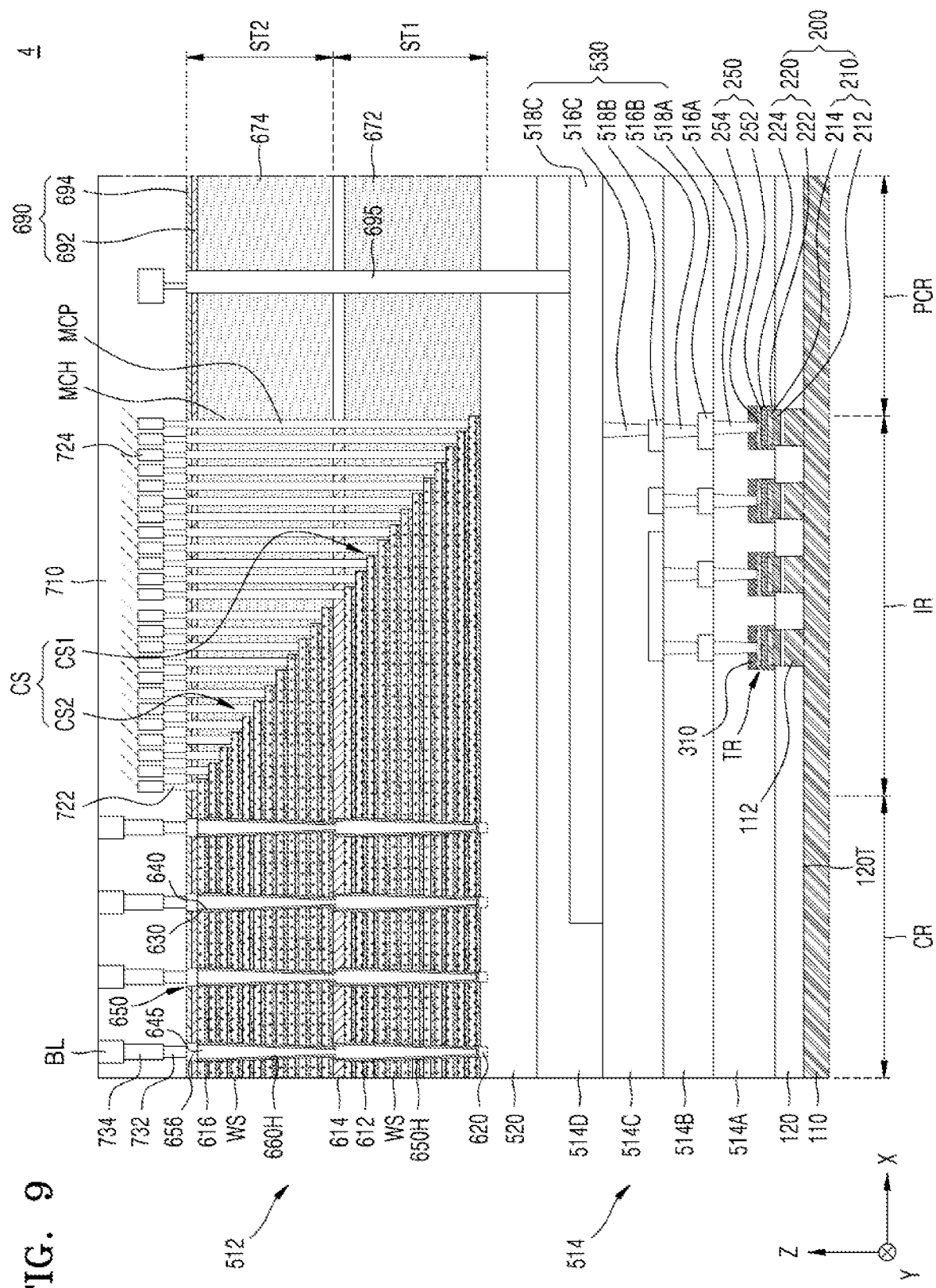
FIG. 9 is a cross-sectional view illustrating a semiconductor device having a memory cell array according to an exemplary embodiment of the present inventive concept.

FIG. 9 is a cross-sectional view illustrating a semiconductor device 4 having a memory cell array according to an exemplary embodiment of the present inventive concept.

Referring to FIG. 9, the semiconductor device 4 includes a peripheral circuit area 514 formed at a first vertical level on a substrate 110 and a memory cell array area 512 formed at a second vertical level higher than the first vertical level on the substrate 110. The substrate 110 may have a main surface 110M extending in the first horizontal direction (the X direction) and the second horizontal direction (the Y direction). The substrate 110 may have a cell area CR, a connection area IR, and a plug connection area PCR. The connection area IR may be disposed between the cell area CR and the plug connection area PCR.

A plurality of transistors TR forming the peripheral circuit area 514 may be formed on the substrate 110. Each of the plurality of transistors TR may be one of the transistors TR, TRa, TRb, and TRc of the semiconductor devices 1, 1a, 1b, and 1c illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6.

A plurality of interlayer insulating layers 514A, 514B, 514C, and 514D may be sequentially laminated on the substrate 110 on which the plurality of transistors TR are formed. The plurality of interlayer insulating layers 514A, 514B, 514C, and 514D may include, for example, silicon oxide ($SiO_2$) or silicon oxynitride (SiON). The peripheral circuit area 514 includes a multilayer wiring structure 530 electrically connected to the plurality of transistors TR. The multilayer wiring structure 530 may be insulated by the plurality of interlayer insulating layers 514A, 514B, 514C, and 514D.

The multilayer wiring structure 530 may include a first contact 516A, a first wiring layer 518A, a second contact 516B, a second wiring layer 518B, a third contact 516C, and a third wiring layer 518C that are sequentially laminated on the substrate 110 and electrically connected to each other. For example, the first contact 516A may be electrically connected to the capping conductive layer 250 and the gate electrode 200 through the capping insulation layer 310.

A semiconductor layer 520 covering the plurality of interlayer insulating layers 514A, 514B, 514C, and 514D is formed on the peripheral circuit area 514. For example, the semiconductor layer 520 may cover the peripheral circuit area 514. The memory cell array area 512 is formed on the semiconductor layer 520. At least a part of the plurality of interlayer insulating layers 514A, 514B, 514C, and 514D may be the interlayer insulating layer 400 illustrated in FIGS. 1A to 6.

The memory cell array MCA illustrated in FIG. 8 may be formed in the memory cell array area 512. The memory cell array area 512 includes a first stack ST1 and a second stack ST2 sequentially laminated on the semiconductor layer 520. It is illustrated that the first stack ST1 and the second stack ST2 are laminated in the semiconductor device 4. However, the present inventive concept is not limited thereto. For example, three or more stacks may be sequentially laminated on the semiconductor layer 520.

The first stack ST1 includes a first cell laminated structure CS1 in which a plurality of first insulating layers 612 and a plurality of word line structures WS are alternately laminated one by one, and the second stack ST2 includes a second cell laminated structure CS2 in which a plurality of second insulating layers 616 and a plurality of word line structures WS are alternately laminated one by one. The first cell laminated structure CS1 and the second cell laminated structure CS2 may be respectively arranged over the cell area CR and the connection area IR. Edges of the first cell laminated structure CS1 and the second cell laminated structure CS2 may be stepped in the connection area IR. The steps in the first cell laminated structure CS1 and the second cell laminated structure CS2 may have areas decreasing by a given rate from a lowermost level toward an uppermost level thereof. For example, the steps included in the first cell laminated structure CS1 and the second cell laminated structure CS2 may have lengths extending in the first horizontal direction (the X direction), and the lengths may gradually decrease from a lowermost one toward an uppermost one thereof The first stack ST1 may further include a first filling insulation layer 672 and a first protective insulating layer 614 covering an upper surface of the first cell laminated structure CS1 and an upper surface of the first filling insulation layer 672. The first filling insulation layer 672 may cover the stepped structure of the first cell laminated structure CS1 in the connection area IR. The upper surface of the first filling insulation layer 672 may be coplanar with the upper surface of the first cell laminated structure CS1. The first filling insulation layer 672 may be formed of silicon oxide ($SiO_2$).

The second stack ST2 may further include a second filling insulation layer 674 and a second protective insulating layer 690 covering an upper surface of the second cell laminated structure CS2 and an upper surface of the second filling insulation layer 674. The second filling insulation layer 674 may be formed of silicon oxide ($SiO_2$). The second protective insulating layer 690 may include a first layer 692 and a second layer 694. In an exemplary embodiment of the present inventive concept, the first layer 692 may be formed of the same material as the first protective insulating layer 614. For example, the first layer 692 may be formed of silicon oxide ($SiO_2$) and the second layer 694 may include a silicon nitride ($Si_3N_4$) layer. In an exemplary embodiment of the present inventive concept, the second protective insulating layer 690 may be omitted. In an exemplary embodiment of the present inventive concept, the second protective insulating layer 690 may be formed of only the first layer 692 and the second layer 694 may be omitted.

A plurality of first channel holes 650H passing through the first cell laminated structure CS1 and a plurality of second channel holes 660H passing through the second cell laminated structure CS2 may be connected to each other and may form a plurality of connection channel holes. The plurality of connection channel holes may extend from the first stack ST1 to the second stack ST2.

The plurality of connection channel holes including a plurality of second channel holes 660H and a plurality of first channel holes 650H may be filled with a plurality of channel structures 650. The plurality of channel structures 650 may be formed in each of the first horizontal direction (the X direction) and the second horizontal direction (the Y direction) to form a channel structure array. Each of the plurality of channel structures 650 may include a semiconductor pattern 620, a charge storage structure 630, a channel layer 640, a buried insulating layer 645, and a conductive plug layer 656. The charge storage structure 630 may include a tunneling dielectric layer, a charge storage layer, and a blocking dielectric layer.

On the conductive plug layer 656 of each of the plurality of channel structures 650, a first conductive stud 732, a bit line BL, and an upper conductive via 734 interposed between the first conductive stud 732 and the bit line BL may be arranged. An interwiring insulation layer 710 may surround the plurality of first conductive studs 732, the plurality of upper conductive vias 734, and the plurality of bit lines BL. The plurality of bit lines BL may be spaced apart from one another at uniform intervals in the first horizontal direction (the X direction) and may extend in the second horizontal direction (the Y direction). The plurality of channel structures 650 and the plurality of bit lines BL may be connected through the plurality of first conductive studs 732 and the plurality of upper conductive vias 734.

In the connection area IR, a plurality of conductive contact plugs MCP may be electrically connected to the plurality of word line structures WS while filling a plurality of contact holes MCH exposing the plurality of word line structures WS. Each of the conductive contact plugs MCP may include a metal silicide pattern, a metal nitride pattern and a metal pattern sequentially stacked on the upper surface of the corresponding one of the word line structure WS and formed in each of the contact holes MCH. The plurality of conductive contact plugs MCP may respectively extend from the plurality of word line structures WS electrically connected thereto in the vertical direction (the Z direction).

The plurality of conductive contact plugs MCP may be electrically connected to a plurality of conductive connection wiring lines 724 through a plurality of second conductive studs 722. The plurality of conductive connection wiring lines 724 may be electrically connected to the plurality of transistors TR. The plurality of conductive connection wiring lines 724 may extend at a horizontal level closer to the semiconductor layer 520 than the plurality of bit lines BL.

In the semiconductor device 4, the memory cell array area 512 and the peripheral circuit area 514 may be electrically connected to each other through at least one connection plug 695 arranged in a plug connection area PCR while extending in the vertical direction (the Z direction). In an exemplary embodiment of the present inventive concept, the at least one connection plug 695 may pass through the first filling insulation layer 672 and the second filling insulation layer 674. The upper surfaces of the at least one connection plug 695 and the conductive contact plugs MCP may be substantially coplanar with each other.

The plurality of conductive connection wiring lines 724 of the memory cell array area 512 may be electrically connected to the peripheral circuit area 514 through the at least one connection plug 695. The at least one connection plug 695 may be electrically connected to the multilayer wiring structure 530. For example, the at least one connection plug 695 may be connected to a third wiring layer 518C.

Figure 10:
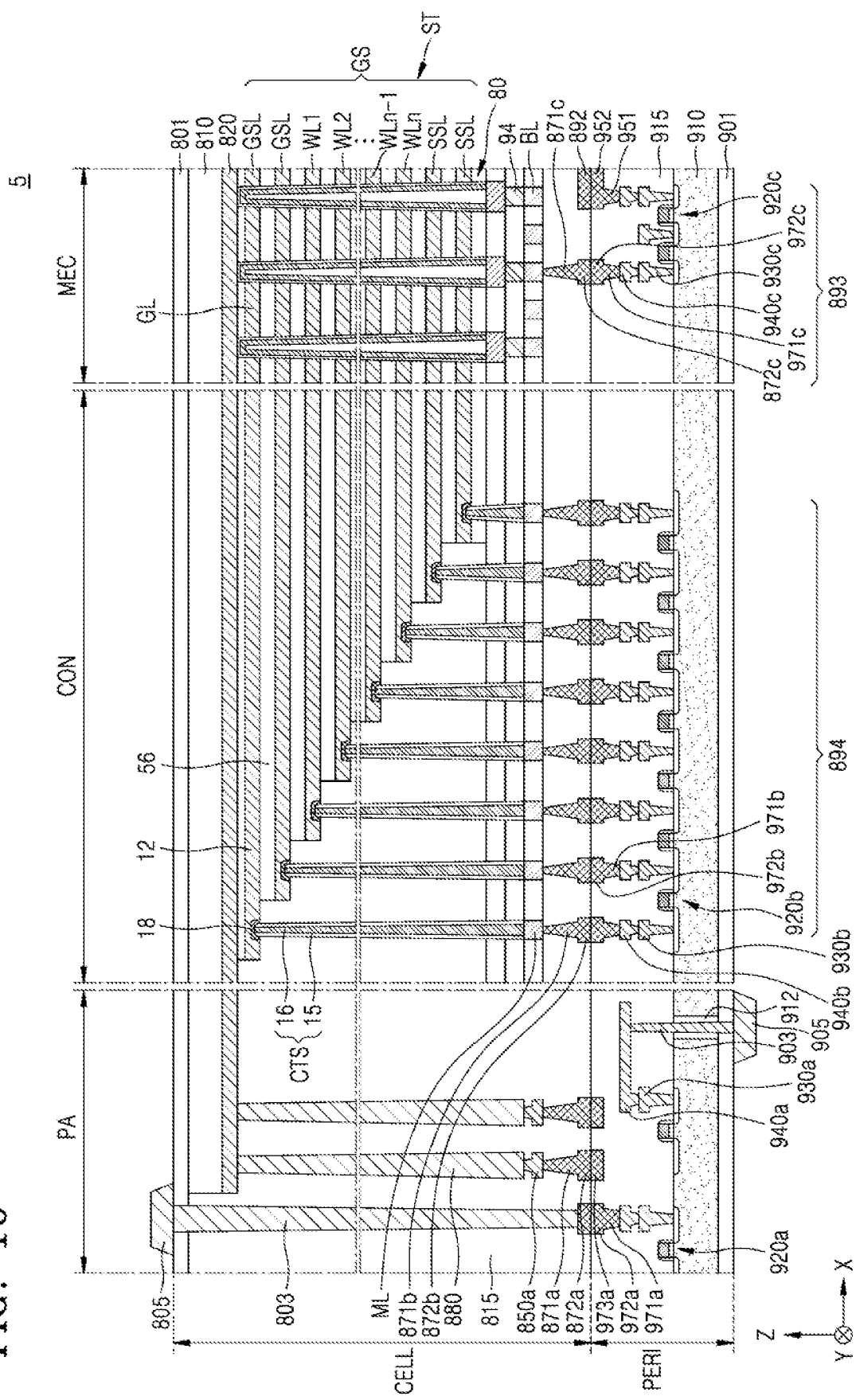
FIG. 10 is a cross-sectional view illustrating a semiconductor device according to an exemplary embodiment of the present inventive concept.

FIG. 10 is a cross-sectional view illustrating a semiconductor device 5 according to an exemplary embodiment of the present inventive concept.

Referring to FIG. 10, the semiconductor device 5 may have a chip to chip (C2C) structure. In the C2C structure, after manufacturing an upper chip including a cell area CELL on a first wafer and manufacturing a lower chip including a peripheral circuit area PERI on a second wafer different from the first wafer, the upper chip and the lower chip may be connected by a bonding method. For example, the C2C structure may have a cell-over-pen (COP) structure. For example, in the bonding method, bonding metal formed in the uppermost metal layer of the upper chip including the cell area CELL may be electrically connected to bonding metal formed in the uppermost metal layer of the lower chip including the peripheral circuit area PERI. In an exemplary embodiment of the present inventive concept, when the bonding metal is formed of copper (Cu), the bonding method may be Cu-Cu bonding method. In an exemplary embodiment of the present inventive concept, the bonding metal may be formed of aluminum (Al) or tungsten (W).

In the semiconductor device 5, each of the peripheral circuit area PERI and the cell area CELL may include a pad bonding area PA. The cell area CELL may further include a connection area CON and a memory cell area MEC.

The peripheral circuit area PERI may include a first substrate 910, an interlayer insulating layer 915, a plurality of circuit devices 920a, 920b, and 920c formed on the first substrate 910, first metal layers 930a, 930b, and 930c respectively connected to the plurality of circuit devices 920a, 920b, and 920c, and second metal layers 940a, 940b, and 940c formed on the first metal layers 930a, 930b, and 930c. The first substrate 910 may include, for example, a semiconductor substrate such as a silicon (Si) substrate, a germanium (Ge) substrate or a silicon-germanium (SiGe) substrate. Alternatively, the first substrate 910 may include a silicon-on-insulator (SOI) substrate, a germanium-on-insulator (GOI) substrate, or the like. In an exemplary embodiment of the present inventive concept, the first metal layers 930a, 930b, and 930c may be formed of tungsten (W) and the second metal layers 940a, 940b, and 940c may be formed of copper (Cu).

In an exemplary embodiment of the present inventive concept, at least one metal layer may be further formed on the second metal layers 940a, 940b, and 940c. At least a part of the at least one metal layer formed on the second metal layers 940a, 940b, and 940c may be formed of aluminum (Al).

The interlayer insulating layer 915 may cover the plurality of circuit devices 920a, 920b, and 920c, the first metal layers 930a, 930b, and 930c, and the second metal layers 940a, 940b, and 940c. The interlayer insulating layer 915 may be formed of, for example, silicon oxide ($SiO_2$), silicon nitride ($Si_3N_4$), or a combination of silicon oxide ($SiO_2$) and silicon nitride ($Si_3N_4$).

In the peripheral circuit area PERI, in an area overlapping the connection area CON in the vertical direction (the Z direction), lower bonding metals 971b and 972b may be arranged on the second metal layer 940b. On the connection area CON, the lower bonding metals 971b and 972b of the peripheral circuit area PERI may be electrically connected to upper bonding metals 871b and 872b of the cell area CELL by the bonding method. The lower bonding metals 971b and 972b and the upper bonding metals 871b and 872b may be formed of, for example, aluminum (Al), copper (Cu), or tungsten (W).

The cell area CELL may provide at least one memory block. The cell area CELL may include a second substrate 810 and a common source line 820. The second substrate 810 may include, for example, a semiconductor substrate such as a silicon (Si) substrate, a germanium (Ge) substrate or a silicon-germanium (SiGe) substrate. Alternatively, the second substrate 810 may include a silicon-on-insulator (SOI) substrate, a germanium-on-insulator (GOI) substrate, or the like. On the second substrate 810, a gate stack GS including a plurality of gate lines GL and a plurality of conductive pad areas 12 connected to the plurality of gate lines GL may be arranged. The plurality of gate lines GL may include a plurality of word lines WL1, WL2, . . . , WLn-1, and WLn, at least one ground selection line GSL, and at least one string selection line SSL. The plurality of conductive pad areas 12 included in the gate stack GS are arranged on the connection area CON and form a stepped connection unit. Each of the plurality of conductive pad areas 12 may be integrated with one gate line GL selected from the plurality of gate lines GL. Among the second substrate 810, the pair of ground selection lines GSL, the plurality of word lines WL1, WL2, . . . , WLn-1, and WLn, and the pair of string selection lines SSL, an insulating layer 56 is interposed therebetween. For example, each insulating layer 56 may be disposed between two adjacent gate lines GL and/or each gate line may be disposed between two adjacent insulating layers 56.

In the memory cell area MEC, a plurality of channel structures 80 may be connected to upper bonding metals 871c and 872c through bit line contact pads 94 and a plurality of bit lines BL. The plurality of bit lines BL may be electrically connected to a circuit device included in the peripheral circuit area PERI, for example, a circuit device 920c providing a page buffer 893 through the upper bonding metals 871c and 872c. The upper bonding metals 871c and 872c may be connected to lower bonding metals 971c and 972c connected to the circuit device 920c of the page buffer 893. The lower bonding metals 971c and 972c and the upper bonding metals 871c and 872c may be formed of, for example, aluminum (Al), copper (Cu), or tungsten (W).

In the connection area CON, the plurality of conductive pad areas 12 may extend to run parallel with an upper surface of the second substrate 810 and may be connected to a plurality of contact structures CTS through a metal silicide layer 18. Each of the plurality of contact structures CTS may include a contact plug 16 longitudinally extending in the vertical direction (the Z direction) and an insulating plug 15 surrounding the contact plug 16. In each of the plurality of contact structures CTS, the other end opposite to one end connected to the metal silicide layer 18 may be connected to the upper bonding metals 871b and 872b. The plurality of contact structures CTS may be connected to the peripheral circuit area PERI through the upper bonding metals 871b and 872b of the cell area CELL and the lower bonding metals 971b and 972b of the peripheral circuit area PERI.

Each of the plurality of contact structures CTS may be electrically connected to the circuit device 920b providing a row decoder 894 in the peripheral circuit area PERI. In an exemplary embodiment of the present inventive concept, an operating voltage of the circuit device 920b providing the row decoder 894 may be different from an operating voltage of the circuit device 920c providing the page buffer 893. For example, the operating voltage of the circuit device 920c providing the page buffer 893 may be higher than the operating voltage of the circuit device 920b providing the row decoder 894.

A plurality of common source line contact plugs 880 may be arranged in the pad bonding area PA. Each of the plurality of common source line contact plugs 880 may be electrically connected to the common source line 820. Each of the plurality of common source line contact plugs 880 may be formed of, for example, a metal, a metal compound, polysilicon (p-Si), or a combination of the above materials. Among the plurality of common source line contact plugs 880, a metal layer 850a may be connected to the other end opposite to one end of one common source line contact plug 880 connected to the common source line 820. The metal layer 850a may be connected to upper metal patterns 871a and 872a. Each of the upper metal patterns 871a and 872a may be connected to a corresponding one of lower metal patterns 971a, 972a, and 973a of the peripheral circuit area PERI. The lower metal patterns 971a, 972a, and 973a and the upper metal patterns 871a and 872a may be formed of, for example, aluminum (Al), copper (Cu), or tungsten (W).

In the pad bonding area PA, first and second input and output pads 905 and 805 may be arranged. A lower insulating layer 901 covering a lower surface of the first substrate 910 may be formed under the first substrate 910 and the first input and output pad 905 may be formed on the lower insulating layer 901. The first input and output pad 905 may be connected to at least one of the plurality of circuit devices 920a, 920b, and 920c arranged in the peripheral circuit area PERI through a first input and output contact plug 903 passing through the lower insulating layer 901 and the first substrate 910. An insulating layer 912 may be arranged between the first input and output contact plug 903 and the first substrate 910 and may electrically isolate the first input and output contact plug 903 from the first substrate 910.

On the second substrate 810, an upper insulating layer 801 covering the upper surface of the second substrate 810 may be formed. The second input and output pad 805 may be arranged on the upper insulating layer 801. The second input and output pad 805 may be connected to at least one of the plurality of circuit devices 920a, 920b, and 920c arranged in the peripheral circuit area PERI through a second input and output contact plug 803. Each of the plurality of circuit devices 920a, 920b, and 920c may include, for example, but is not limited to, a transistor. For example, each of the plurality of circuit devices 920a, 920b, and 920c may include not only various active elements such as transistors, but also various passive elements such as, for example, a capacitor, a resistor, and an inductor. Each of the transistors included in the plurality of circuit devices 920a, 920b, and 920c may be one of the transistors TR, TRa, TRb, and TRc of the semiconductor devices 1, 1a, 1b, and 1c illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6.

The second input and output contact plug 803 may be arranged in a position apart from the second substrate 810 and the common source line 820. The second input and output pad 805 may not overlap a plurality of conductive pad areas 12 in the vertical direction (the Z direction). The second input and output contact plug 803 may be connected to the second input and output pad 805 through an interlayer insulating layer 815 and the upper insulating layer 801. In an exemplary embodiment of the present inventive concept, one of the first input and output pad 905 and the second input and output pad 805 may be omitted.

In the pad bonding area PA, each of the upper metal patterns 871a and 872a formed in the uppermost metal layer of the cell area CELL may be connected to a corresponding one among the lower metal patterns 971a, 972a, and 973a formed in the uppermost metal layer of the peripheral circuit area PERI. The lower metal pattern 973a formed in the uppermost metal layer of the peripheral circuit area PERI may not be connected to a contact in the peripheral circuit area PERI. For example, in the pad bonding area PA, to correspond to a lower metal pattern formed in the uppermost metal layer of the peripheral circuit area PERI, an upper metal pattern in the same form as that of the lower metal pattern of the peripheral circuit area PERI may be formed in an upper metal layer of the cell area CELL.

On the second metal layer 940b of the connection area CON, the lower bonding metals 971b and 972b may be formed. The lower bonding metals 971b and 972b may be electrically connected to the upper bonding metals 871b and 872b of the cell area CELL by the bonding method.

In the memory cell area MEC, to correspond to lower bonding metals 951 and 952 formed in the uppermost metal layer of the peripheral circuit area PERI, an upper metal pattern 892 may be arranged in the uppermost metal layer of the cell area CELL.

Figure 11:
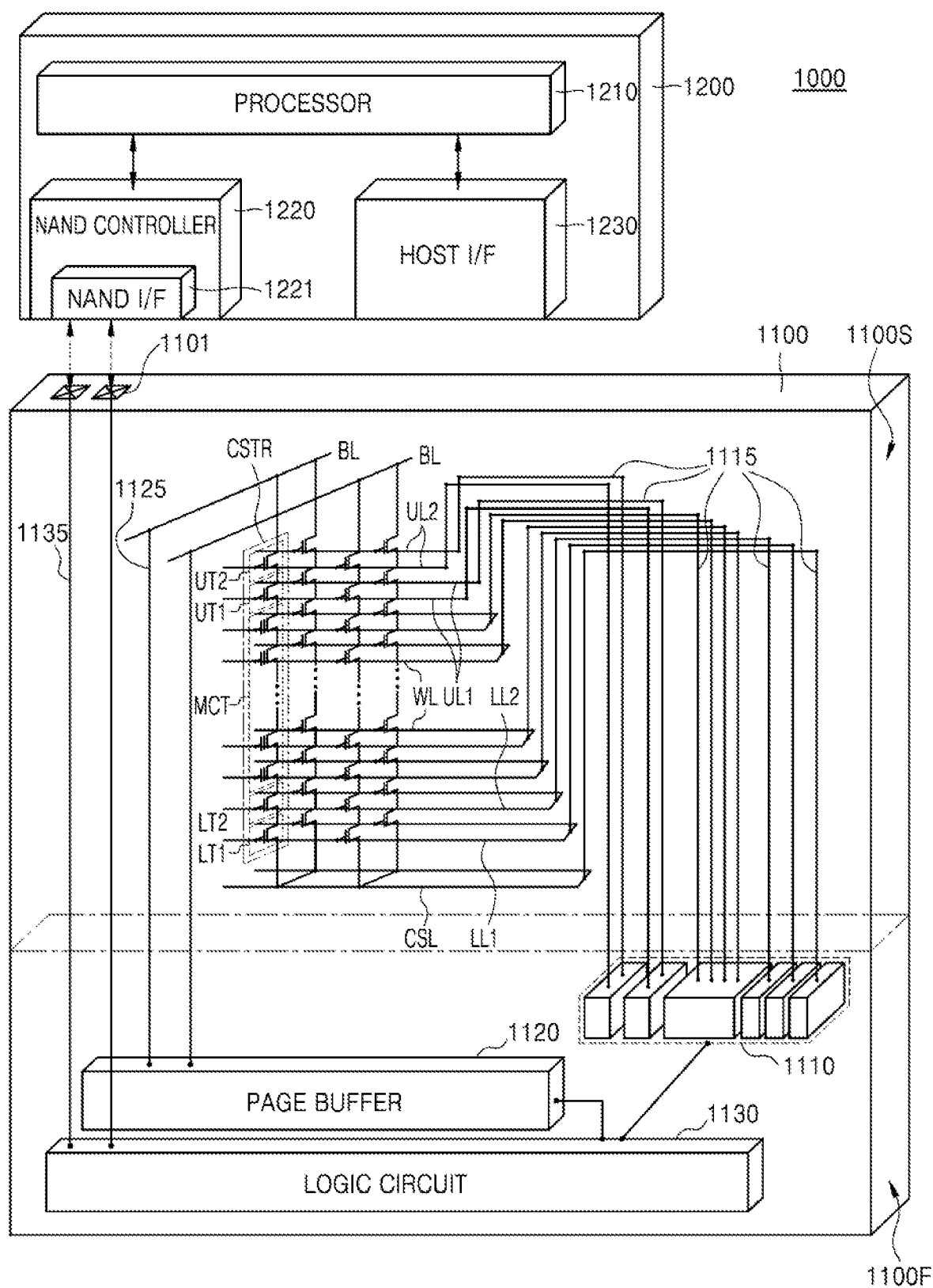
FIG. 11 is a view schematically illustrating an electronic system including a semiconductor device according to an exemplary embodiment of the present inventive concept.

FIG. 11 is a view schematically illustrating an electronic system 1000 including a semiconductor device 1100 according to an exemplary embodiment of the present inventive concept. Referring to FIG. 11, the electronic system 1000 according to an exemplary embodiment of the present inventive concept may include the semiconductor device 1100 and a controller 1200 electrically connected to the semiconductor device 1100. The electronic system 1000 may be a storage device including the one or plurality of semiconductor devices 1100 or an electronic device including the storage device. For example, the electronic system 1000 may be, for example, a solid state drive (SSD) device, a universal serial bus (USB), a computing system, a medical device, or a communication device including the at least one semiconductor device 1100.

The semiconductor device 1100 may be a non-volatile memory device. For example, the semiconductor device 1100 may be a NAND flash memory device including at least one structure among the structures described above for the semiconductor devices 1, 1a, 1b, 1c, 2, 3, 4, and 5 with reference to FIGS. 1 to 10. The semiconductor device 1100 may include a first structure 1100F and a second structure 1100S on the first structure 1100F. In an exemplary embodiment of the present inventive concept, the first structure 1100F may be arranged by the second structure 1100S. The first structure 1100F may be a peripheral circuit structure including a decoder circuit 1110, a page buffer 1120, and a logic circuit 1130. The second structure 1100S may be a memory cell structure including a plurality of bit lines BL, a common source line CSL, a plurality of word lines WL, first and second gate upper lines UL1 and UL2, first and second gate lower lines LL1 and LL2, and a plurality of memory cell strings CSTR disposed between the plurality of bit lines BL and the common source line CSL.

In the second structure 1100S, each of the plurality of memory cell strings CSTR may include lower transistors LT1 and LT2 adjacent to the common source line CSL, upper transistors UT1 and UT2 adjacent to the plurality of bit lines BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may vary in accordance with an exemplar embodiment of the present inventive concept.

In an exemplary embodiment of the present inventive concept, the upper transistors UT1 and UT2 may include string selection transistors and the lower transistors LT1 and LT2 may include ground selection transistors. A plurality of gate lower lines LL1 and LL2 may be respectively gate electrodes of the lower transistors LT1 and LT2. The plurality of word lines WL may be gate electrodes of the plurality of memory cell transistors MCT and the first and second gate upper lines UL1 and UL2 may be gate electrodes of the upper transistors UT1 and UT2.

The common source line CSL, the plurality of gate lower lines LL1 and LL2, the plurality of word lines WL, and the first and second gate upper lines UL1 and UL2 may be electrically connected to the decoder circuit 1110 through a plurality of first connection wiring lines 1115 extending to the second structure 1100S in the first structure 1100F. The plurality of bit lines BL may be electrically connected to the page buffer 1120 through a plurality of second connection wiring lines 1125 extending to the second structure 1100S from the first structure 1100F.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130. Each of the decoder circuit 1110, the page buffer 1120 and the logic circuit 1130 may include a plurality of circuit devices. Each of the circuit device may include, for example, but is not limited to, a transistor. The transistor may be one of the transistors TR, TRa, TRb, and TRc of the semiconductor devices 1, 1a, 1b, and 1c illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6.

The semiconductor device 1100 may communicate with the controller 1200 through input and output pads 1101 electrically connected to the logic circuit 1130. The input and output pads 1101 may be electrically connected to the logic circuit 1130 through input and output connection wiring lines 1135 extending to the second structure 1100S from the first structure 1100F.

The controller 1200 may include a processor 1210, a NAND controller 1220, and a host interface (HOST I/F) 1230. According to an exemplary embodiment of the present inventive concept, the electronic system 1000 may include the plurality of semiconductor devices 1100. In this case, the controller 1200 may control the plurality of semiconductor devices 1100.

The processor 1210 may control an overall operation of the electronic system 1000 including the controller 1200. The processor 1210 may operate in accordance with predetermined firmware and may control the NAND controller 1220 to access the plurality of semiconductor devices 1100. The NAND controller 1220 may include a NAND interface (NAND I/F) 1221 processing communication with the plurality of semiconductor devices 1100. Through the NAND interface 1221, a control command for controlling the plurality of semiconductor devices 1100, data to be written in the plurality of memory cell transistors MCT of the plurality of semiconductor devices 1100, and data to be read from the plurality of memory cell transistors MCT of the plurality of semiconductor devices 1100 may be transmitted. A host interface 1230 may provide a communication function between the electronic system 1000 and an external host. When the control command is received from the external host through the host interface 1230, the processor 1210 may control the plurality of semiconductor devices 1100 in response to the control command.

Figure 12:
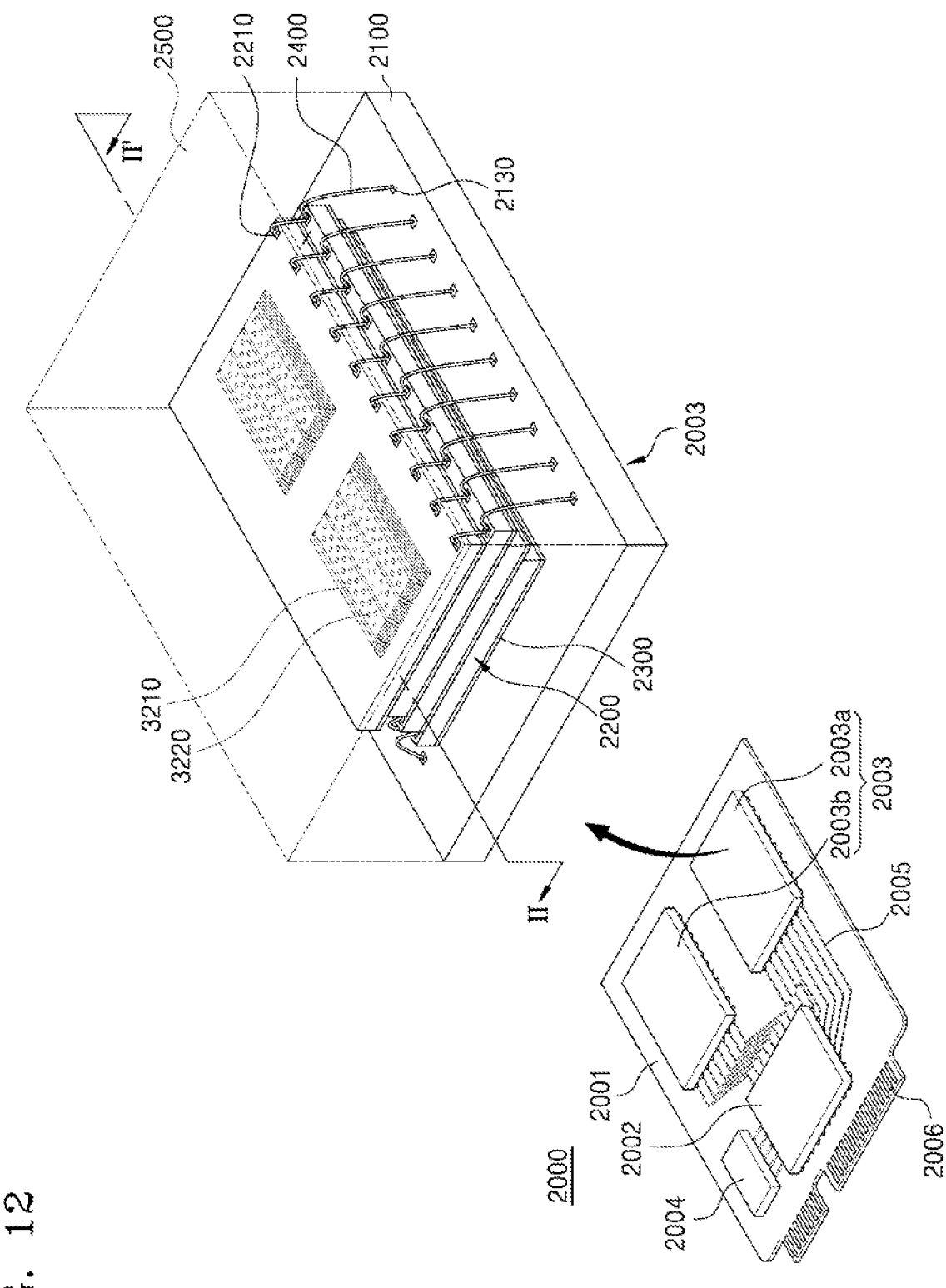
FIG. 12 is a view schematically illustrating an electronic system including a semiconductor device according to an exemplary embodiment of the present inventive concept.

FIG. 12 is a view schematically illustrating an electronic system 2000 including a semiconductor device according to an exemplary embodiment of the present inventive concept.

Referring to FIG. 12, the electronic system 2000 according to an exemplary embodiment of the present inventive concept may include a main substrate 2001, a controller 2002 mounted on the main substrate 2001, at least one semiconductor package 2003, and dynamic random access memory (DRAM) 2004. The semiconductor package 2003 and the DRAM 2004 may be connected to the controller 2002 by a plurality of wiring patterns 2005 formed on the main substrate 2001.

The main substrate 2001 may include a connector 2006 including a plurality of pins combined with an external host. In the connector 2006, the number and arrangement of pins may vary in accordance with a communication interface between the electronic system 2000 and the external host. In an exemplary embodiment of the present inventive concept, the electronic system 2000 may communicate with the external host in accordance with one of interfaces such as, for example, a universal serial bus (USB), peripheral component interconnect express (PCI-Express), serial advanced technology attachment (SATA), and M-Phy for universal flash storage (UFS). In an exemplary embodiment of the present inventive concept, the electronic system 2000 may operate by power received from the external host through the connector 2006. The electronic system 2000 may further include a power management integrated circuit (PMIC) distributing power received from the external host to the controller 2002 and the semiconductor package 2003.

The controller 2002 may write data in the semiconductor package 2003, may read data from the semiconductor package 2003, and may increase an operating speed of the electronic system 2000.

The DRAM 2004 may be buffer memory for reducing a speed difference between the semiconductor package 2003 that is a data storage space and the external host. The DRAM 2004 included in the electronic system 2000 may operate as a kind of cache memory and may provide a space for temporarily storing data in a control operation for the semiconductor package 2003. When the DRAM 2004 is included in the electronic system 2000, the controller 2002 may further include a DRAM controller for controlling the DRAM 2004 other than the NAND controller 1220 for controlling the semiconductor package 2003.

The semiconductor package 2003 may include first and second semiconductor packages 2003a and 2003b spaced apart from each other. Each of the first and second semiconductor packages 2003a and 2003b may include a plurality of semiconductor chips 2200. Each of the first and second semiconductor packages 2003a and 2003b may include a package substrate 2100, a plurality of semiconductor chips 2200 disposed on the package substrate 2100, an adhesive layer 2300 arranged on a lower surface of each of the plurality of semiconductor chips 2200, connection structures 2400 electrically connecting the plurality of semiconductor chips 2200 to the package substrate 2100, and a molding layer 2500 covering the plurality of semiconductor chips 2200 and the connection structures 2400.

The package substrate 2100 may be a printed circuit board (PCB) including a plurality of package upper pads 2130. Each of the plurality of semiconductor chips 2200 may include input and output pads 2210. The input and output pads 2210 may correspond to the input and output pads 1101 of FIG. 11. Each of the plurality of semiconductor chips 2200 may include a plurality of gate stacks 3210 and a plurality of channel structures 3220. Each of the plurality of semiconductor chips 2200 may include at least one of the semiconductor devices 1, 1a, 1b, 1c, 2, 3, 4, and 5 with reference to FIGS. 1 to 10. For example, the transistor included in each of the plurality of semiconductor chips 2200 may be one of the transistors TR, TRa, TRb, and TRc of the semiconductor devices 1, 1a, 1b, and 1c illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6.

In an exemplary embodiment of the present inventive concept, the connection structures 2400 may be bonding wires electrically connecting the input and output pads 2210 to the package upper pads 2130. Therefore, in the first and second semiconductor packages 2003*a* and 2003*b*, the plurality of semiconductor chips 2200 may be electrically connected to one another by a bonding wire method and may be electrically connected to the package upper pads 2130 of the package substrate 2100. According to an exemplary embodiment of the present inventive concept, in the first and second semiconductor packages 2003*a* and 2003*b*, the plurality of semiconductor chips 2200 may be electrically connected to one another by connection structures including a through silicon via (TSV) instead of the connection structures 2400 in the bonding wire method.

In an exemplary embodiment of the present inventive concept, the controller 2002 and the plurality of semiconductor chips 2200 may be included in one package. In an exemplary embodiment of the present inventive concept, the controller 2002 and the plurality of semiconductor chips 2200 may be mounted on an interposer substrate different from the main substrate 2001, and the controller 2002 and the plurality of semiconductor chips 2200 may be connected to each other by wiring lines formed on the interposer substrate.

Figure 13:
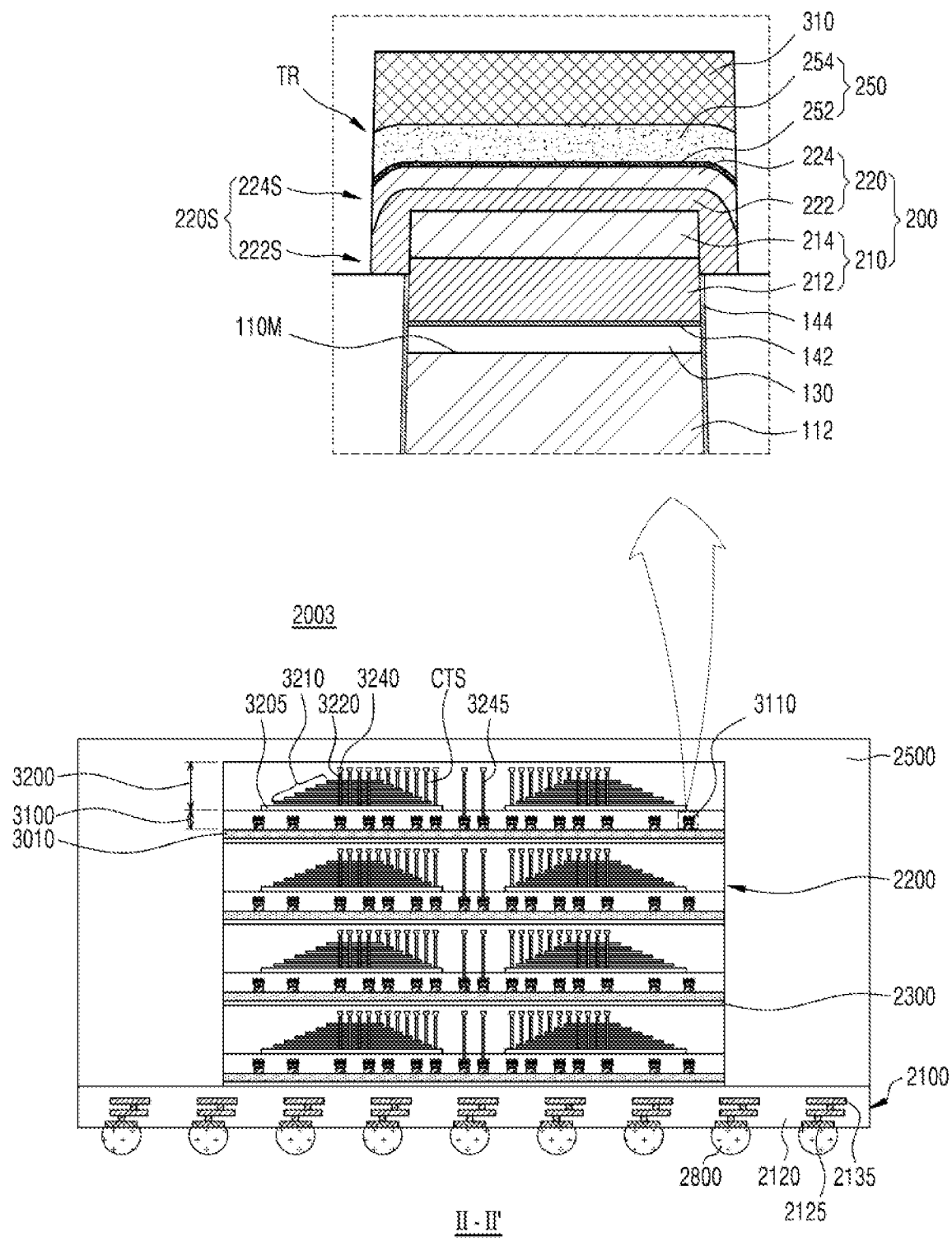
FIG. 13 is a cross-sectional view schematically illustrating a semiconductor package according to an exemplary embodiment of the present inventive concept.

FIG. 13 is a cross-sectional view schematically illustrating a semiconductor package 2003 according to an exemplary embodiment of the present inventive concept. In FIG. 13, a configuration of a cross-section taken along line II-II' of FIG. 12 is described in detail.

Referring to FIG. 13, in the semiconductor package 2003, the package substrate 2100 may be a PCB. The package substrate 2100 may include a package substrate body 2120, a plurality of package upper pads 2130 (refer to FIG. 12) arranged on an upper surface of the package substrate body 2120, a plurality of lower pads 2125 arranged on or exposed through a lower surface of the package substrate body 2120, and a plurality of internal wiring lines 2135 electrically connecting the plurality of package upper pads 2130 to the plurality of lower pads 2125 in the package substrate body 2120. The plurality of package upper pads 2130 may be electrically connected to the plurality of connection structures 2400. The plurality of lower pads 2125 may be connected to the plurality of wiring patterns 2005 on the main substrate 2001 of the electronic system 2000 illustrated in FIG. 12 through a plurality of conductive connection units 2800.

Each of the plurality of semiconductor chips 2200 may include a semiconductor substrate 3010 and a first structure 3100 and a second structure 3200 sequentially laminated on the semiconductor substrate 3010. The first structure 3100 may include a peripheral circuit area including a plurality of peripheral wiring lines 3110. The first structure 3100 may include a gate electrode 200 electrically connected to the plurality of peripheral wiring lines 3110. A detailed configuration and various variations of the gate electrode 200 are approximately the same as described for the gate electrodes 200, 200*a*, 200*b*, 200*c*, 200P and 200N with reference to FIGS. 1 to 7G. For example, the first structure 3100 may include a plurality of transistors, and each of the transistors may be one of the transistors TR, TRa, TRb, and TRc of the semiconductor devices 1, 1*a*, 1*b*, and 1*c* illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6. Because each of the above described transistors (e.g. TR, TRa, TRb, TRc, TR-L, TR-M, TR-H, TRP and TRN) including the gate electrode (e.g., 200, 200*a*, 200*b*, 200*c*, 200P or 200N) according to the present inventive concept may prevent impurities ions from diffusing into the gate dielectric layer (e.g., 130, 130L, 130M or 130H) and the active area 112 that form each of the above described transistors, characteristics and dispersion of each of the above described transistors may be prevented from deteriorating. The second structure 3200 may include a common source line 3205, a gate stack 3210 on the common source line 3205, the plurality of channel structures 3220 passing through the gate stack 3210, and a plurality of bit lines 3240 electrically connected to the plurality of channel structures 3220. The gate stack 3210 may include a plurality of word lines (WL of FIG. 8) and the plurality of conductive pad areas 12 integrated with the plurality of word lines WL. In addition, each of the plurality of semiconductor chips 2200 may include the plurality of contact structures CTS electrically connected to the plurality of conductive pad areas 12 of the gate stack 3210 and a plurality of metal silicide layers 18 disposed between the plurality of conductive pad areas 12 and the plurality of contact structures CTS. The plurality of conductive pad areas 12 may be respectively connected to the plurality of contact structures CTS through the plurality of metal silicide layers 18.

The plurality of semiconductor chips 2200 may be electrically connected to the plurality of peripheral wiring lines 3110 of the first structure 3100 and may include through wiring lines 3245 extending to the second structure 3200. The through wiring lines 3245 may be arranged outside the gate stack 3210. In an exemplary embodiment of the present inventive concept, the semiconductor package 2003 may further include through wiring lines 3245 passing through the gate stack 3210. Each of the plurality of semiconductor chips 2200 may further include input and output pads (2210 of FIG. 12) electrically connected to the plurality of peripheral wiring lines 3110 of the first structure 3100.

Figure 14:
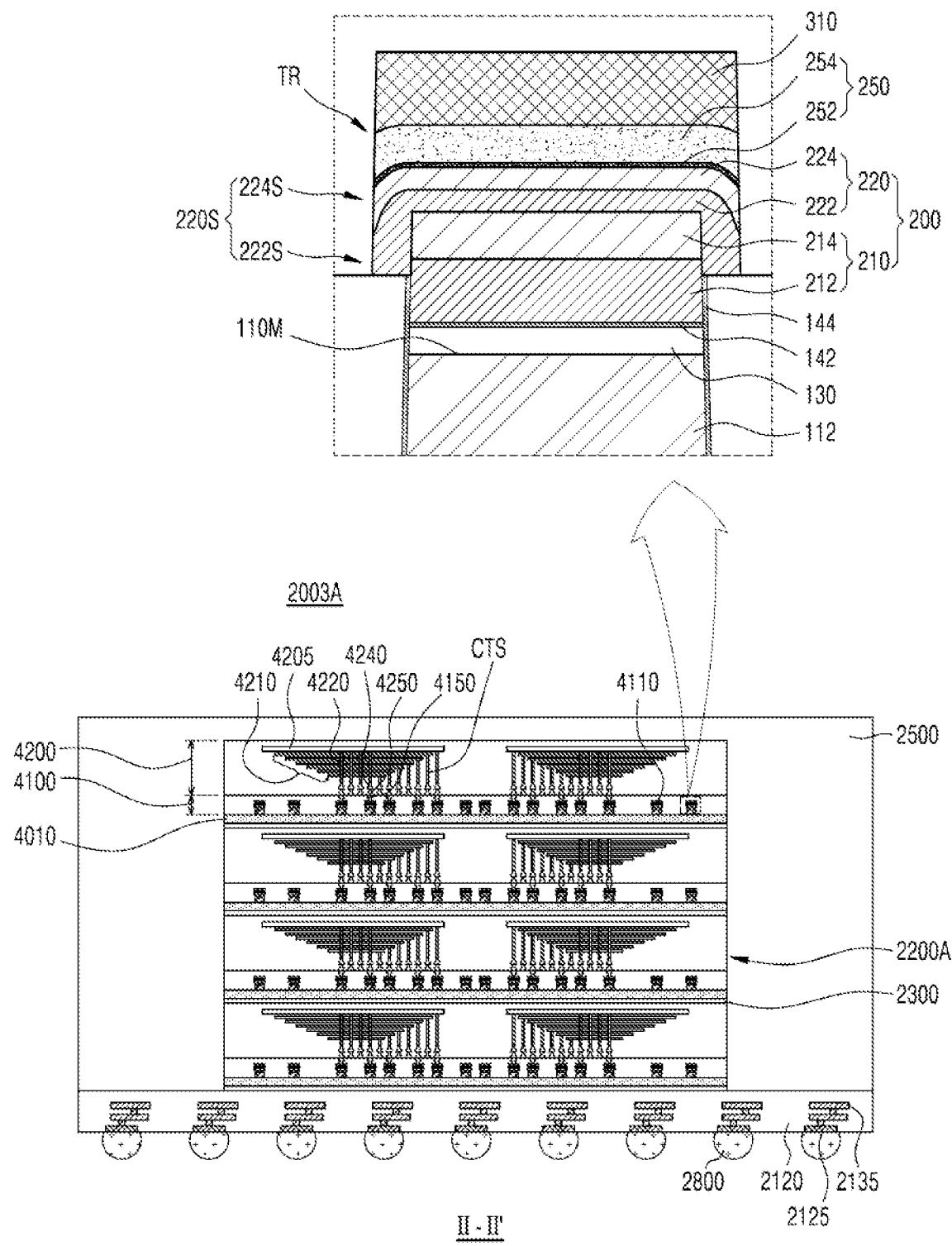
FIG. 14 is a cross-sectional view schematically illustrating a semiconductor package according to an exemplary embodiment of the present inventive concept.

FIG. 14 is a cross-sectional view schematically illustrating a semiconductor package 2003A according to an exemplary embodiment of the present inventive concept. In FIG. 14, a configuration of a cross-section taken along line II-II' of FIG. 12 is described in detail.

Referring to FIG. 14, the semiconductor package 2003A has approximately the same configuration as that of the semiconductor package 2003 described with reference to FIG. 13. The semiconductor package 2003A includes a plurality of semiconductor chips 2200A. Each of the plurality of semiconductor chips 2200A may include a semiconductor substrate 4010, a first structure 4100 on the semiconductor substrate 4010, and a second structure 4200 disposed on the first structure 4100 and combined with the first structure 4100 by a wafer bonding method.

The first structure 4100 may include a peripheral circuit area including a plurality of peripheral wiring lines 4110 and a plurality of first junction structures 4150. The first structure 4100 may include a gate electrode 200 electrically connected to the plurality of peripheral wiring lines 4110. A detailed configuration and various variations of the gate electrode 200 are approximately the same as described for the gate electrodes 200, 200*a*, 200*b*, 200*c*, 200P and 200N with reference to FIGS. 1 to 7G. For example, the first structure 4100 may include a plurality of transistors, and each of the transistors may be one of the transistors TR, TRa, TRb, and TRc of the semiconductor devices 1, 1*a*, 1*b*, and 1*c* illustrated in FIGS. 1A to 4, the first transistor TR-L, the second transistor TR-M, and the third transistor TR-H of the semiconductor device 2 illustrated in FIG. 5, and the first transistor TRP and the second transistor TRN of the semiconductor device 3 illustrated in FIG. 6. Because each of the above described transistors (e.g. TR, TRa, TRb, TRc, TR-L, TR-M, TR-H, TRP and TRN) including the gate electrode (e.g., 200, 200a, 200b, 200c, 200P or 200N) according to the present inventive concept may prevent impurities ions from diffusing into the gate dielectric layer (e.g., 130, 130L, 130M or 130H) and the active area 112 that form each of the above described transistors, characteristics and dispersion of each of the above described transistors may be prevented from deteriorating. A second structure 4200 may include a common source line 4205, a gate stack 4210 disposed between the common source line 4205 and the first structure 4100, and a plurality of channel structures 4220 passing through the gate stack 4210. The gate stack 4210 may include a plurality of word lines (WL of FIG. 8) and the plurality of conductive pad areas 12 integrated with the plurality of word lines WL. In addition, each of the plurality of semiconductor chips 2200A may include the plurality of contact structures CTS electrically connected to the plurality of conductive pad areas 12 of the gate stack 4210 and a plurality of metal silicide layers 18 disposed between the plurality of conductive pad areas 12 and the plurality of contact structures CTS. The plurality of conductive pad areas 12 may be respectively connected to the plurality of contact structures CTS through the plurality of metal silicide layers 18.

In addition, each of the plurality of semiconductor chips 2200A may include a plurality of second junction structures 4250 electrically connected to the plurality of word lines (WL of FIG. 8) of the gate stack 4210. For example, the plurality of second junction structures 4250 may be electrically connected to the plurality of channel structures 4220 through a plurality of bit lines 4240, and may be electrically connected to the plurality of word lines (WL of FIG. 8) through the plurality of contact structures CTS.

The plurality of first junction structures 4150 of the first structure 4100 and the plurality of second junction structures 4250 of the second structure 4200 may be combined with each other while contacting each other. Combined portions of the plurality of first junction structures 4150 and the plurality of second junction structures 4250 may be formed of, for example, copper (Cu).

The plurality of semiconductor chips 2200 illustrated in FIG. 13 and the plurality of semiconductor chips 2200A illustrated in FIG. 14 may be electrically connected to each other by the plurality of connection structures 2400 (refer to FIG. 12) in the form of bonding wires. In an exemplary embodiment of the present inventive concept, the plurality of semiconductor chips 2200 illustrated in FIG. 13 and the plurality of semiconductor chips 2200A illustrated in FIG. 14 may be electrically connected to each other by connection structures including the TSV.

While the present inventive concept has been particularly shown and described with reference to exemplary embodiments thereof, it will be understood that various changes in form and details may be made therein without departing from the spirit and scope of the present inventive concept as defined by the appended claims.

What is claimed is:

1. A semiconductor device comprising:
   a peripheral circuit area formed on a substrate;
   a semiconductor layer covering the peripheral circuit area; and
   a memory cell array area formed on the semiconductor layer, p1 wherein the memory cell array area comprises:
   a first cell laminated structure and a second cell laminated structure on the first cell laminated structure each including a plurality of insulating layers and a plurality of word line structures alternately laminated on the semiconductor layer; and
   a plurality of channel structures filling a plurality of first channel holes passing through the first cell laminated structure and a plurality of second channel holes connected to the plurality of first channel holes and passing through the second cell laminated structure,
   wherein the peripheral circuit area comprises:
   an active area limited by an isolation layer in the substrate;
   a gate dielectric layer disposed on the active area;
   a gate electrode including a lower gate layer and an upper gate layer on the lower gate layer, the lower gate layer being on the gate dielectric layer; and
   a pair of impurity areas formed in portions of the active area on both sides of the gate electrode in a gate length direction,
   wherein the upper gate layer covers an uppermost surface of the lower gate layer and parts of side surfaces of the lower gate layer in a gate width direction orthogonal to the gate length direction of the gate electrode, and
   wherein a lowermost surface of the upper gate layer is directly on top of a portion of an uppermost surface of the isolation layer.

2. The semiconductor device of claim 1, wherein the upper gate layer comprises a first upper gate layer and a second upper gate layer on the first upper gate layer, with the first upper gate layer including carbon, and the second upper gate layer not including carbon.

3. The semiconductor device of claim 2, wherein the first upper gate layer contacts the uppermost surface of the isolation layer, and
   wherein the second upper gate layer is spaced apart from the isolation layer with the first upper gate layer interposed therebetween.

4. The semiconductor device of claim 2, wherein the lower gate layer comprises a first lower gate layer and a second lower gate layer on the first lower gate layer, with the first lower gate layer including carbon, and the second lower gate layer not including carbon.

5. The semiconductor device of claim 4, wherein the first lower gate layer, the second lower gate layer, and the second upper gate layer include polysilicon, and
   wherein the first upper gate layer includes polysilicon or amorphous silicon.

6. The semiconductor device of claim 4, wherein a thickness of the lower gate layer has a value greater than that of a thickness of the upper gate layer.

7. The semiconductor device of claim 4, wherein a thickness of the first lower gate layer has a value greater than that of a thickness of the second lower gate layer.

8. The semiconductor device of claim 4, wherein a thickness of the first upper gate layer has a value the same as that of a thickness of the second upper gate layer.

9. The semiconductor device of claim 4, wherein a ratio of carbon of the first upper gate layer is the same as a ratio of carbon of the first lower gate layer.

10. The semiconductor device of claim 4, wherein the first upper gate layer includes carbon having a ratio higher than that of carbon included in the first lower gate layer.

11. The semiconductor device of claim 10, wherein the first lower gate layer, the second lower gate layer, and the second upper gate layer include polysilicon, and wherein the first upper gate layer includes polysilicon or amorphous silicon having an average grain size with a value smaller than that of an average grain size of the first lower gate layer.

12. The semiconductor device of claim 2, wherein the upper gate layer further comprises a third upper gate layer on the second upper gate layer, with the third upper gate layer including carbon having a ratio the same as that of carbon included in the first upper gate layer.

13. The semiconductor device of claim 1, wherein a width of the upper gate layer of the gate electrode in the gate length direction has a value the same as that of a width of the lower gate layer, and wherein a width of the upper gate layer of the gate electrode in the gate width direction has a value greater than that of a width of the lower gate layer.

* * * * *